(12) United States Patent
Hung et al.

(10) Patent No.: US 12,477,818 B2
(45) Date of Patent: Nov. 18, 2025

(54) REDUCTION OF DAMAGES TO SOURCE/DRAIN FEATURES

(71) Applicant: Taiwan Semiconductor Manufacturing Company, Ltd., Hsinchu (TW)

(72) Inventors: Hsin Yang Hung, Hsinchu (TW); Wei-Syuan Dai, Hsinchu (TW); Tsung-Yu Chiang, New Taipei (TW); Lung Chen, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 609 days.

(21) Appl. No.: 17/745,996

(22) Filed: May 17, 2022

(65) Prior Publication Data

US 2023/0135084 A1    May 4, 2023

Related U.S. Application Data

(60) Provisional application No. 63/273,736, filed on Oct. 29, 2021.

(51) Int. Cl.
*H10D 84/85* (2025.01)
*H10D 62/13* (2025.01)
(Continued)

(52) U.S. Cl.
CPC ......... *H10D 84/853* (2025.01); *H10D 62/151* (2025.01); *H10D 62/832* (2025.01);
(Continued)

(58) Field of Classification Search
CPC ......... H01L 27/0924; H01L 21/823814; H01L 21/823821; H01L 21/823878;
(Continued)

(56) References Cited

U.S. PATENT DOCUMENTS 11,276,763 B2    3/2022  Diaz et al.
2018/0108575 A1*  4/2018  Li .................. H01L 21/823864
(Continued)

FOREIGN PATENT DOCUMENTS

KR    20140101259 A    8/2014
KR    20140107073 A    9/2014
(Continued)

*Primary Examiner* — Fernando L Toledo
*Assistant Examiner* — Adam S Bowen
(74) *Attorney, Agent, or Firm* — HAYNES AND BOONE, LLP

(57) ABSTRACT

Semiconductor structure and methods of forming the same are provided. A semiconductor structure according to the present disclosure include a substrate that includes a first region and a second region adjacent the first region, a first fin disposed over the first region, a second fin disposed over the second region, a first source/drain feature disposed over the first fin and a second source/drain feature disposed over the second fin, and an isolation structure disposed between the first fin and the second fin. The isolation structure has a protruding feature rising above the rest of the isolation structure and the protruding feature is disposed between the first fin and the second fin.

20 Claims, 26 Drawing Sheets

(51) Int. Cl.
*H10D 62/832* (2025.01)
*H10D 64/01* (2025.01)
*H10D 84/01* (2025.01)
*H10D 84/03* (2025.01)

(52) U.S. Cl.
CPC ......... *H10D 64/017* (2025.01); *H10D 84/017* (2025.01); *H10D 84/0188* (2025.01); *H10D 84/0193* (2025.01); *H10D 84/038* (2025.01)

(58) Field of Classification Search
CPC ............... H01L 29/0847; H01L 29/161; H01L 29/66545; H01L 29/165; H01L 29/7848; H01L 21/823864; H01L 29/66795; H01L 29/785; H10D 84/853; H10D 62/151; H10D 62/832; H10D 64/017; H10D 84/017; H10D 84/0188; H10D 84/0193; H10D 84/038; H10D 30/797; H10D 62/822; H10D 30/024; H10D 30/62; H10D 84/0184
See application file for complete search history.

(56) References Cited

U.S. PATENT DOCUMENTS

| | | |
|---|---|---|
| 2018/0197791 A1 | 7/2018 | Choi |
| 2019/0067120 A1 | 2/2019 | Ching |
| 2019/0164966 A1* | 5/2019 | Wang ..................... H01L 29/45 |
| 2020/0075421 A1* | 3/2020 | Wu .................. H01L 21/76877 |
| 2021/0118991 A1* | 4/2021 | Ahn .................... H01L 29/0673 |
| 2021/0193534 A1 | 6/2021 | Chen |
| 2021/0257261 A1 | 8/2021 | Feng-Ching |
| 2021/0257482 A1 | 8/2021 | Feng-Ching |

FOREIGN PATENT DOCUMENTS

| | | |
|---|---|---|
| KR | 20150128532 A | 11/2015 |
| KR | 20160102787 A | 8/2016 |
| KR | 20160115655 A | 10/2016 |
| KR | 20180079160 A | 7/2018 |

\* cited by examiner

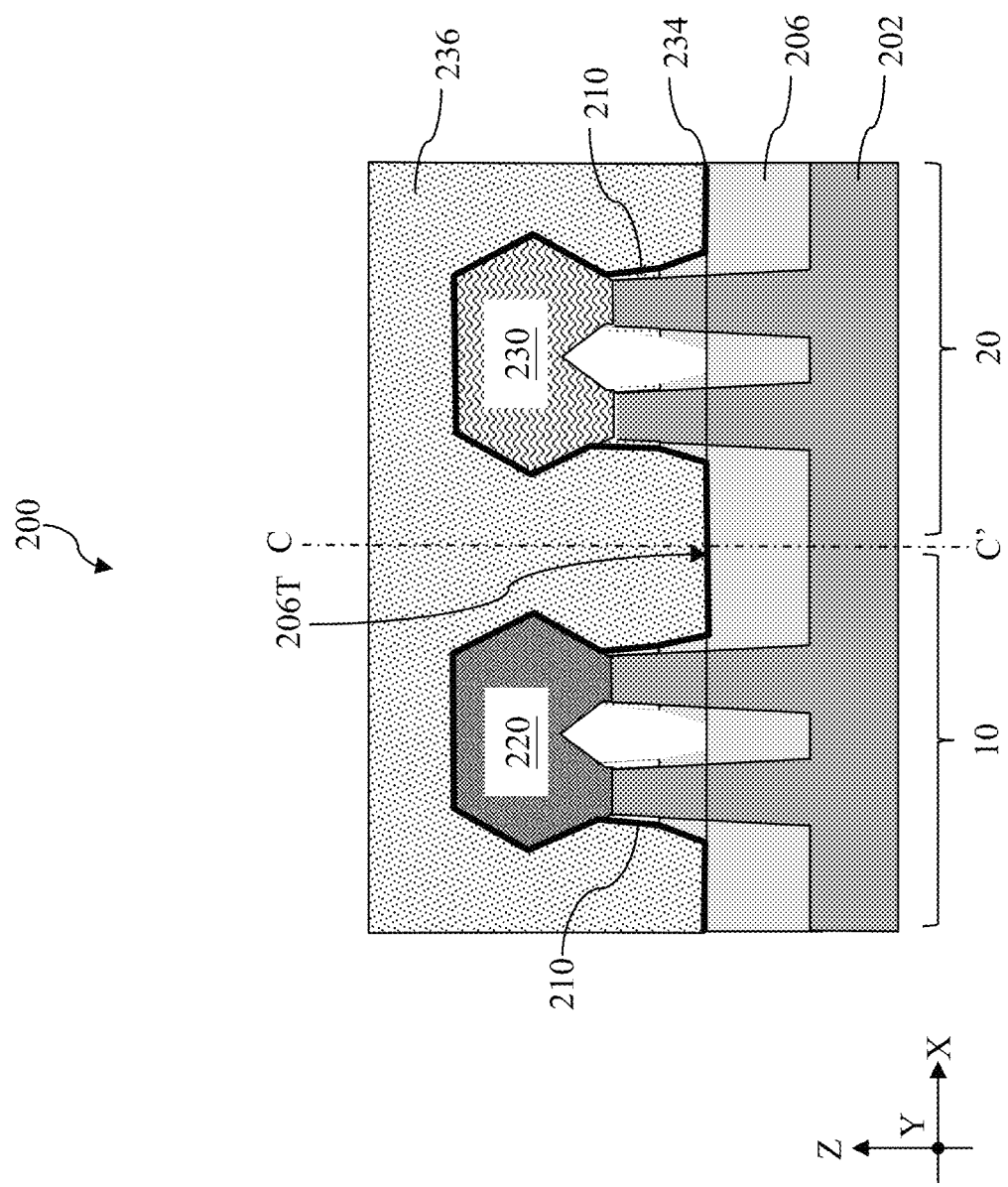

REDUCTION OF DAMAGES TO SOURCE/DRAIN FEATURES

PRIORITY DATA

This application claims priority to U.S. Provisional Patent Application Ser. No. 63/273,736, filed Oct. 29, 2021, the entire disclosure of which is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and gate-all-around (GAA) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). Compared to planar transistors, such configuration provides better control of the channel and drastically reduces SCEs (in particular, by reducing sub-threshold leakage (i.e., coupling between a source and a drain of the FinFET in the "off" state)). A GAA transistor has a gate structure that can extend, partially or fully, around a channel region to provide access to the channel region on two or more sides. The channel region of the GAA transistor may be formed from nanowires, nanosheets, other nanostructures, and/or other suitable structures. Shape of the channel region also give a GAA transistor names such as a nanowire transistor or a nanosheet transistor. In some instances, a GAA transistor may also be referred to as a multi-bridge channel (MBC) transistor.

Multi-gate devices of different conductivity types may be placed side-by-side in a semiconductor device. To improve performance, multi-gate devices of different conductivity types may include different source/drain features that are formed separately. In some situations, the first-to-form source/drain features may be damaged when the last-to-form source/drain features are being formed. Therefore, although existing methods for forming multi-gate transistors are generally adequate for their intended purposes, they are not satisfactory in every respect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2-26 illustrate cross-sectional views of a workpiece during a fabrication process according to the method of FIG. 1, according to one or more aspects of the present disclosure.

DETAILED DESCRIPTION

Figure 1:
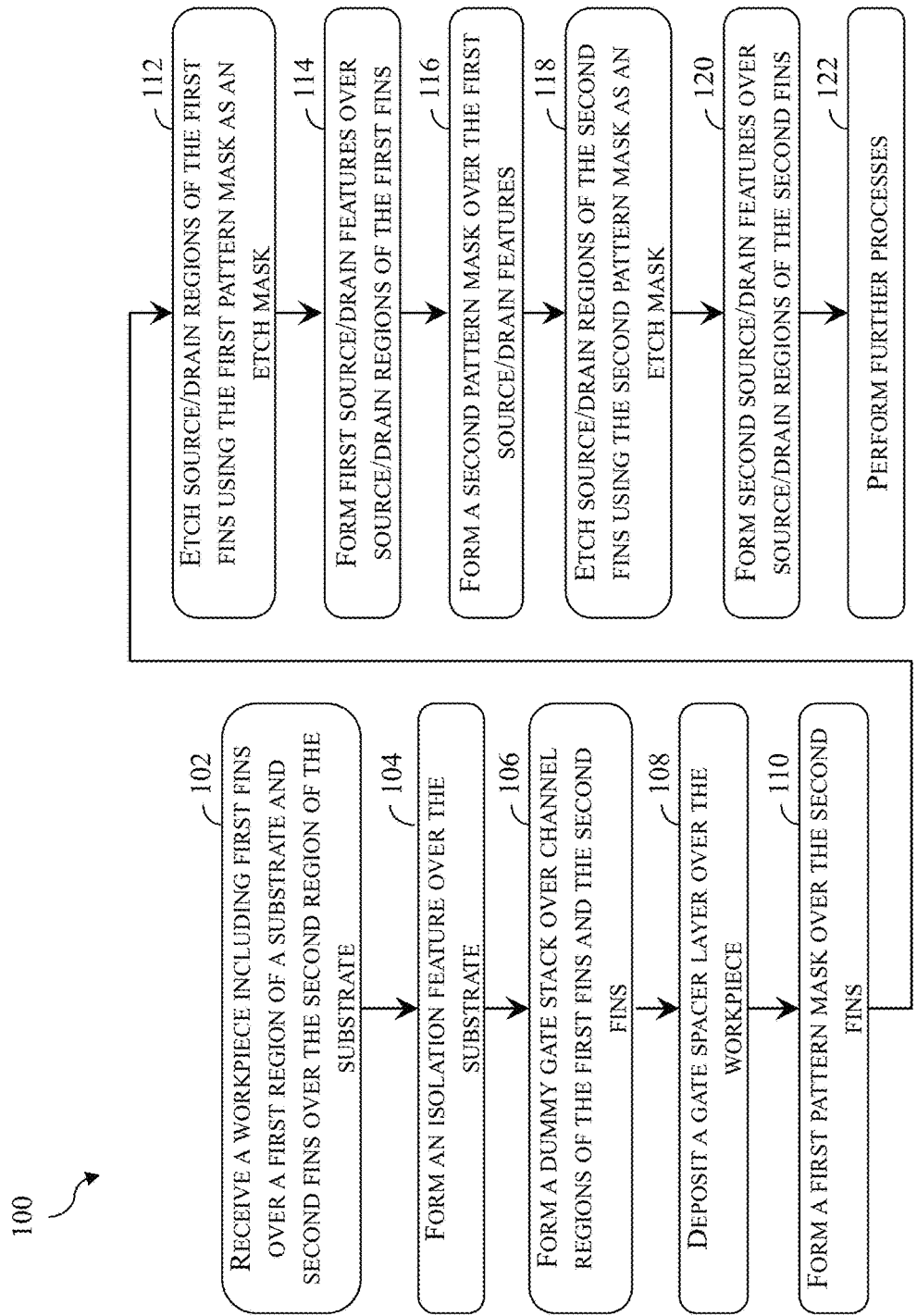
FIG. 1. Illustrates a flow chart of a method for forming over a workpiece source/drain features of different conductivity types, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/-10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/-15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally related to formation of multi-gate transistors, and more particularly to formation of different source/drain features in a multi-gate transistor. A design of the semiconductor device may include an n-type multi-gate transistor placed next to a p-type multi-gate transistor. For example, a static random access memory (SRAM) cell include n-type transistors placed next to p-type transistors. To improve respective device performance, different source/drain features may be implemented in n-type multi-gate transistors and p-type multi-gate transistors. Due to their differences in terms of composition and dopant type, n-type source/drain features and p-type source/drain features are formed separately. For example, n-type source/drain features may be formed while the p-type source/drain regions are covered. After the n-type source/drain features are formed, p-type source/drain features are formed over p-type source/drain regions while the n-type source/drain regions are protected by a patterned hard mask. In some existing technology, the two patterned masks are designed to terminate right along a center line between an n-type active region and an adjacent p-type active region. When the etching processes are not substantially anisotropic, the patterned hard mask may have a bowling profile that tend to damage and expose a portion of the first-to-form n-type source/drain features. A portion of the p-type source/drain feature may be deposited on the exposed portion of the n-type source/drain features, leading to shorts or leakage.

The present disclosure provides methods to improve patterning of the hard masks when n-type source/drain features and p-type source/drain features are formed. These methods provide a patterned hard mask with a straighter profile that is less likely to damage or expose source/drain features that are already formed. Depending on the lithography processes, methods of the present disclosure may form a ridge or a trench in an isolation feature disposed at or near a center line between a p-type source/drain feature and an adjacent n-type source/drain feature.

The various aspects of the present disclosure will now be described in more detail with reference to the figures. In that regard, FIG. 1 is a flowchart illustrating a method 100 for forming a semiconductor structure from a workpiece according to embodiments of the present disclosure. Method 100 is merely an example and is not intended to limit the present disclosure to what is explicitly illustrated herein. Additional steps can be provided before, during and after the method 100 and some steps described can be replaced, eliminated, or moved around for additional embodiments of the method. Not all steps are described herein in detail for reasons of simplicity. Method 100 is described below in conjunction with FIG. 2-26, which are fragmentary cross-sectional views of a workpiece 200 at different stages of fabrication according to embodiments of the method 100 in FIG. 1. Because the workpiece 200 will be fabricated into a semiconductor structure or a semiconductor device, the workpiece 200 may be referred to herein as a semiconductor structure or a semiconductor device as the context requires. While semiconductor structures illustrated herein include FinFETs, method 100 may be used to form other multi-gate devices, such as GAA transistors. For avoidance of doubts, the X, Y and Z directions in FIGS. 2-26 are perpendicular to one another. Throughout the present disclosure, unless expressly otherwise described, like reference numerals denote like features.

Figure 2:
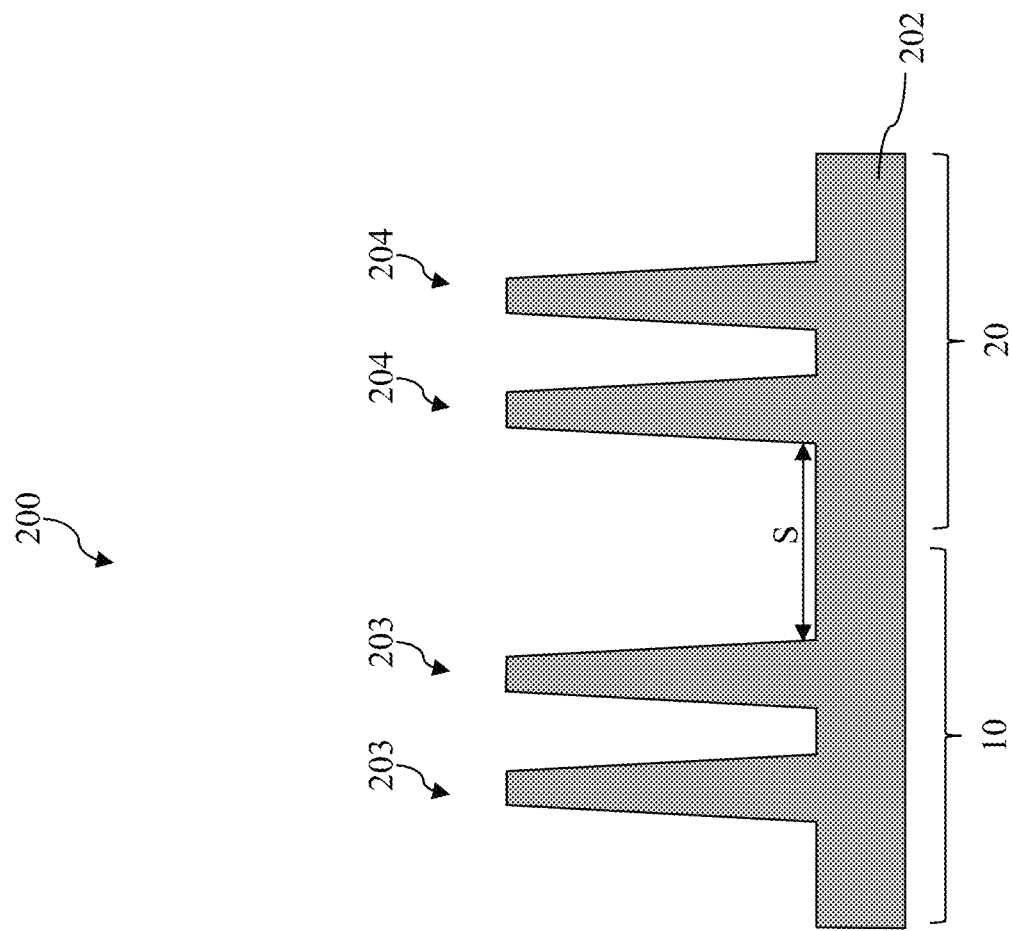

Referring to FIGS. 1 and 2, the method 100 includes block 102 where a workpiece 200 is received. The workpiece 200 includes first fins 203 over a first region 10 of a substrate 202 and second fins 204 over a second region 20 of a substrate 202. In some embodiments, the substrate 202 may be a semiconductor substrate such as a silicon (Si) substrate. The substrate 202 may include various doping configurations depending on design requirements as is known in the art. As shown in FIG. 2, the substrate 202 includes a first region 10 and a second region 20. The first region 10 and the second region 20 are different device regions. For example, the first region 10 may be a p-type device region and the second region 20 may be an n-type device region. Different doping profiles (e.g., n-wells or n-type wells, p-wells or p-type wells) may be formed on the substrate 202. For example, an n-type well may be formed in the first region 10 and a p-type well may be formed in the second region 20. The suitable doping may include ion implantation of dopants and/or diffusion processes. The substrate 202 may also include other semiconductor materials, such as germanium (Ge), silicon carbide (SiC), silicon germanium (SiGe), or diamond. Further, the workpiece 200 may optionally include an epitaxial layer deposited on the substrate 202 using a molecular beam epitaxy (MBE) process, a metalorganic chemical vapor deposition (MOCVD) process, and/or other suitable epitaxial growth processes. The epitaxial layer may be strained for performance improvement. In some implementations, the substrate 202 may further include an embedded insulation layer to include a silicon-on-insulator (SOI) structure, a germanium-on-insulator (GeOI) structure.

The workpiece 200 includes the first fins 203 over the first region 10 and the second fins 204 over the second region 20. The first fins 203 and the second fins 204 may come in pairs that are spaced apart from adjacent fin pairs. For illustration purposes, FIG. 2 includes two first fins 203 over the first region 10 and two second fins 204 over the second region 20. The first fins 203 and the second fins 204 may be patterned from the substrate 202 or an epitaxial layer formed on the substrate 202 using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the first fins 203 and the second fins 204 by etching the substrate 202. The etching process can include dry etching, wet etching, reactive ion etching (RIE), and/or other suitable processes.

Reference is still made to FIG. 2. It is noted that methods according to the present disclosure, such as method 100, have a specific application to workpiece 200 where a spacing S between a first fin 203 over the first region 10 and an adjacent second fin 204 over the second region 20 is between about 20 nm and about 100 nm. This range is not trivial. As will be described further below, when the spacing S is smaller than 20 nm, there is little or no room to retreat edges of patterned photoresist layers by making OPC (optical proximity correction) corrections to GDS (Graphic Design System) layout files. Indeed, when the spacing S is smaller than 20 nm, modification of the GDS files may nevertheless cause damages to source/drain features that are already formed. When the spacing S is greater than 100 nm, there is little or no risk of damages to source/drain features. This is so because such a spacing may accommodate process variations introduced by undercutting during the etching process or unintended edge roughness of patterned photoresist layers. Additionally, when the spacing S is smaller than 20 nm or greater than 100 nm, some of the structural features may not be observable because wet clean processes (to be described below) may eliminate them or blend them in the environment.

Figure 3:
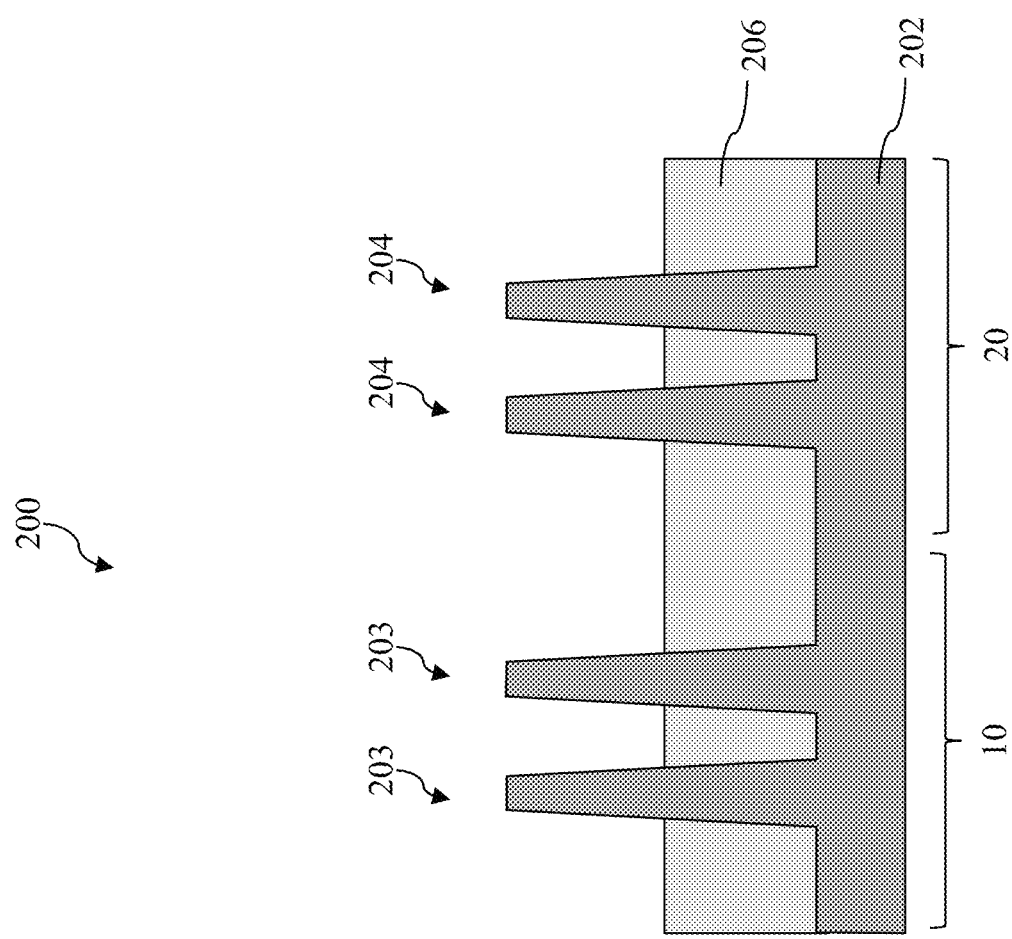

Referring still to FIGS. 1 and 3, method 100 includes a block 104 where an isolation feature 206 is formed. In some instances, the isolation feature 206 may also be referred to as shallow trench isolation (STI) feature 206. By way of example, in some embodiments, a dielectric layer is first deposited over the substrate 202, filling trenches between adjacent fins with the dielectric material. In some embodiments, the dielectric layer may include silicon oxide and may be deposited using high-density plasma chemical vapor deposition (HDPCVD), CVD, flowable CVD (FCVD), or spin-on coating. The deposited dielectric material is then thinned and planarized, for example, by a chemical mechanical polishing (CMP) process. The planarized dielectric layer is further recessed by a dry etching process, a wet etching process, and/or a combination thereof to form the isolation feature 206. As shown in FIG. 3, top portions of the first fins 203 and the second fins 204 may rise above the isolation feature 206 while bottom portions of the first fins 203 and the second fins may remain buried in the isolation feature 206. In some embodiments not explicitly shown, the isolation feature 206 may include a multi-layer structure. For example, the isolation feature 206 may include a liner and a filler where the liner is in direct contact with the substrate 202 and the fins (including the first fins 203 and the second fins 204) and the filler is spaced apart from the substrate 202 and the fins by the liner. In some instances, the liner may include silicon or silicon nitride and the filler may include silicon oxide.

Figure 4:
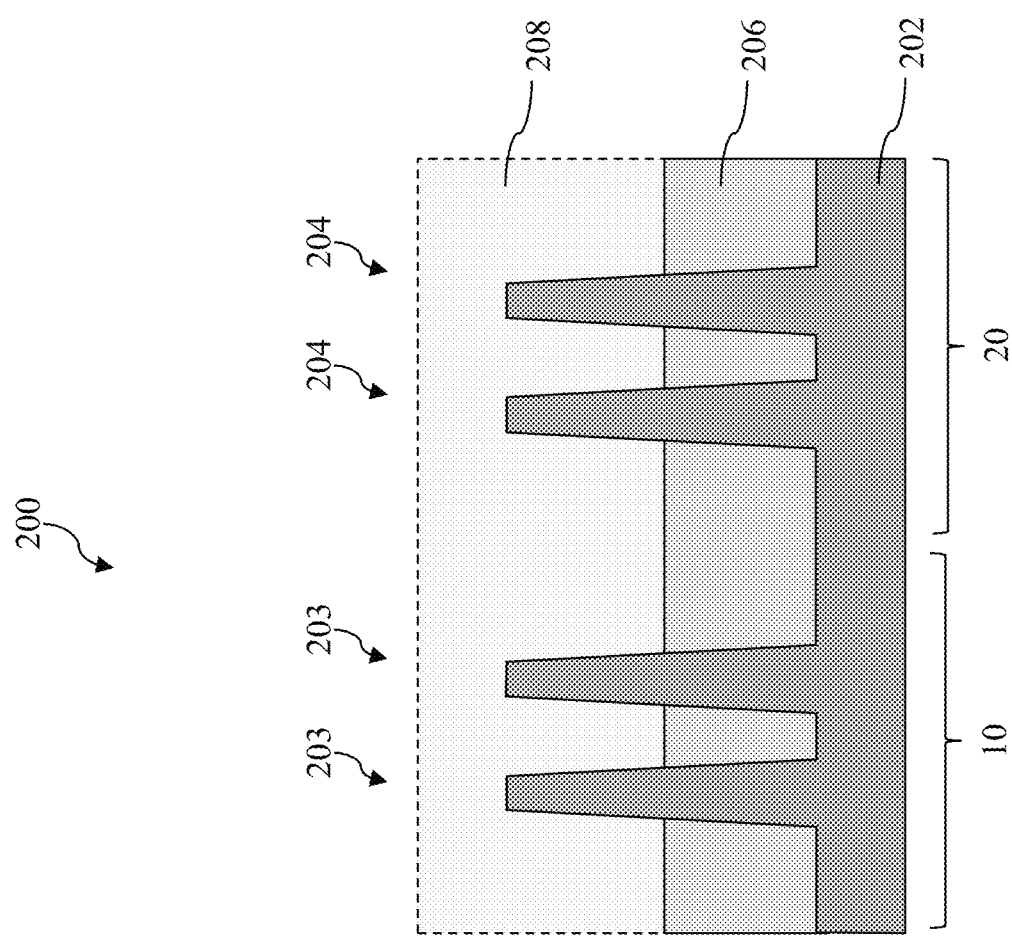

Referring to FIGS. 1 and 4, the method 100 includes a block 106 where a dummy gate stack 208 is formed over channel regions of the first fins 203 and the second fins 204. Each of the first fins 203 and the second fins 204 extends lengthwise along the Y direction. Along the Y direction, each of the first fins 203 and the second fins 204 includes channel regions and source/drain regions. Each of the channel region is disposed between two source/drain regions. In some embodiments, a gate replacement or gate-last process is adopted and the dummy gate stack 208 serves as a placeholder for a high-k metal gate stack and is to be remove and replaced by the high-k metal gate stack. Other processes and configurations are possible. In some embodiments represented in FIG. 4, the dummy gate stack 208 is formed over the substrate 202. The dummy gate stack 208 extends lengthwise along the X direction to intersect the first fins 203 and the second fins 204. The dummy gate stack 208 is formed over surfaces of the channel regions of the first fins 203 and the second fins 204 while the source/drain regions of the first fins 203 and the second fins 204 are not covered by the dummy gate stack 208. FIG. 4 illustrates a cross-section of the source/drain regions of the first fins 203 and the second fins 204. Because the dummy gate stack 208 is disposed over the channel regions and out of plane, the dummy gate stack 208 is illustrated in dotted lines.

The dummy gate stack 208 may include a dummy dielectric layer and a dummy electrode layer. Operations at block 106 may include forming the dummy dielectric layer and the dummy electrode layer over the workpiece 200 and patterning the dummy dielectric layer and the dummy electrode layer such that the source/drain regions are not covered by the dummy dielectric layer or the dummy electrode layer. In some embodiments, the dummy dielectric layer may include silicon oxide and/or other suitable material. In various examples, the dummy dielectric layer may be deposited by a CVD process, a subatmospheric CVD (SACVD) process, a flowable CVD process, an ALD process, or other suitable process. The dummy electrode layer may include polysilicon and may be deposited using low-pressure CVD (LPCVD), CVD or ALD. The deposited dummy dielectric layer and the dummy electrode layer may then to be patterned to form the dummy gate stack 208. For example, the patterning process may include a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods. After the patterning, the dummy gate stack is disposed only over the channel regions of the first fins 203 and the second fins 204.

Figure 5:
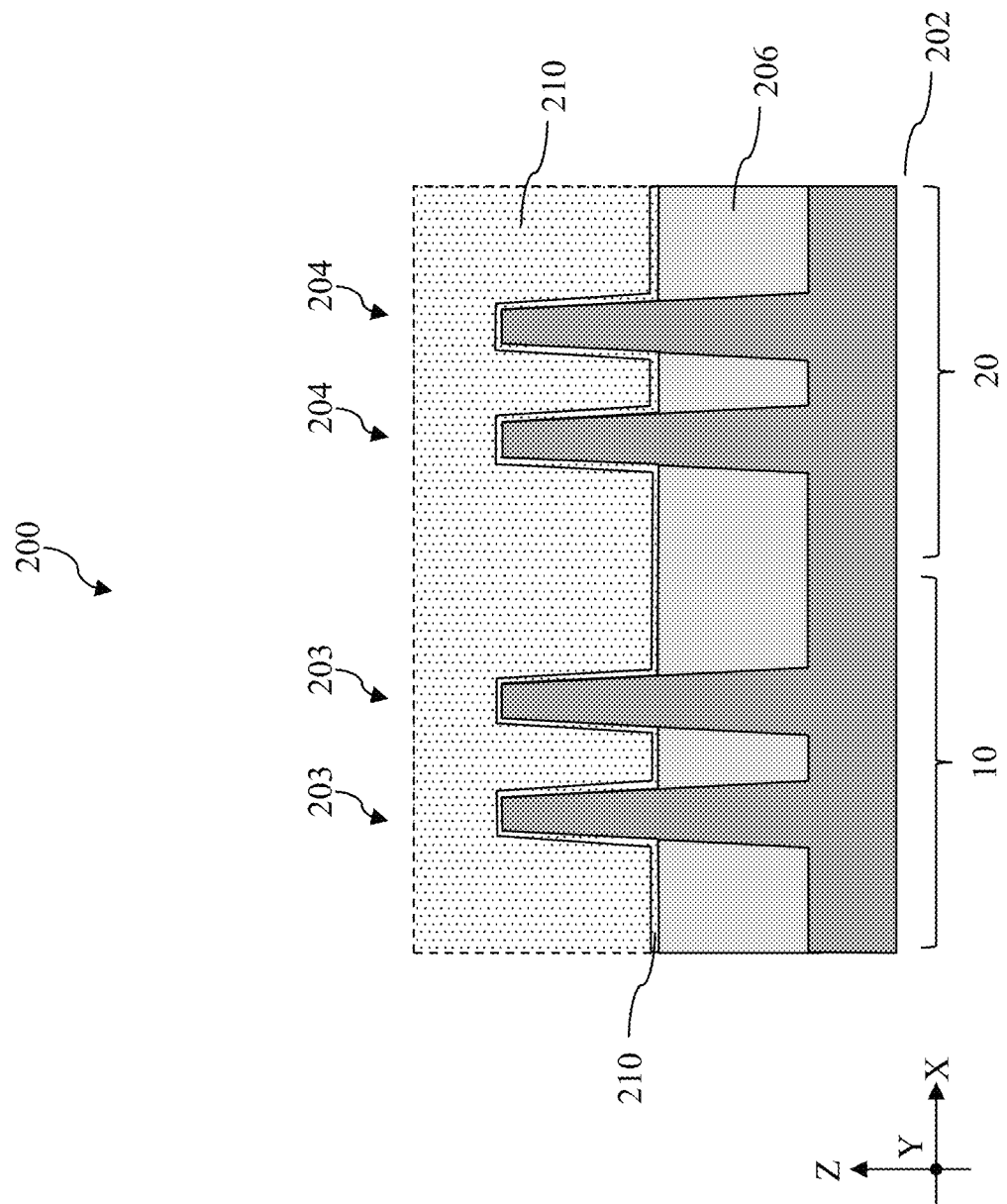

Referring to FIGS. 1 and 5, the method 100 includes a block 108 where a gate spacer layer 210 is deposited over the workpiece 200. In some embodiments, a gate spacer layer 210 is deposited conformally over the workpiece 200, including over a top surface and sidewalls of the dummy gate stack 208, and over top surfaces and sidewalls of the first fins 203 and the second fins 204, and over the top surface of the isolation feature 206. The term "conformally" may be used herein for ease of description of a layer having substantially uniform thickness over various regions. The gate spacer layer 210 may include a dielectric material that is different from the dummy dielectric layer or the dummy electrode in the dummy gate stack 208 such that the dummy gate stack 208 may be selectively removed at a later point without substantially damaging the gate spacer layer 210. The composition of the gate spacer layer 210 is also different from that of the isolation feature 206. In some embodiments, the gate spacer layer 210 may include silicon nitride, silicon oxynitride, silicon carbonitride, silicon oxycarbide, silicon oxycarbonitride, or combinations thereof. In one embodiment, the gate spacer layer 210 include silicon oxycarbonitride (SiOCN), which is more etch-resistant than the dummy dielectric layer but has a dielectric constant smaller than that of silicon nitride (SiN). In some embodiments not explicitly shown in FIG. 5, the gate spacer layer 210 may include multiple layers. The gate spacer layer 210 may be deposited using CVD, subatmospheric CVD (SACVD) process, FCVD, ALD process, or other suitable process. Because the gate spacer layer 210 disposed over sidewalls of the dummy gate stack 208 is over the channel regions and out of plane, the gate spacer layer 210 disposed over sidewalls of the dummy gate stack 208 is illustrated in dotted lines.

Figure 6:
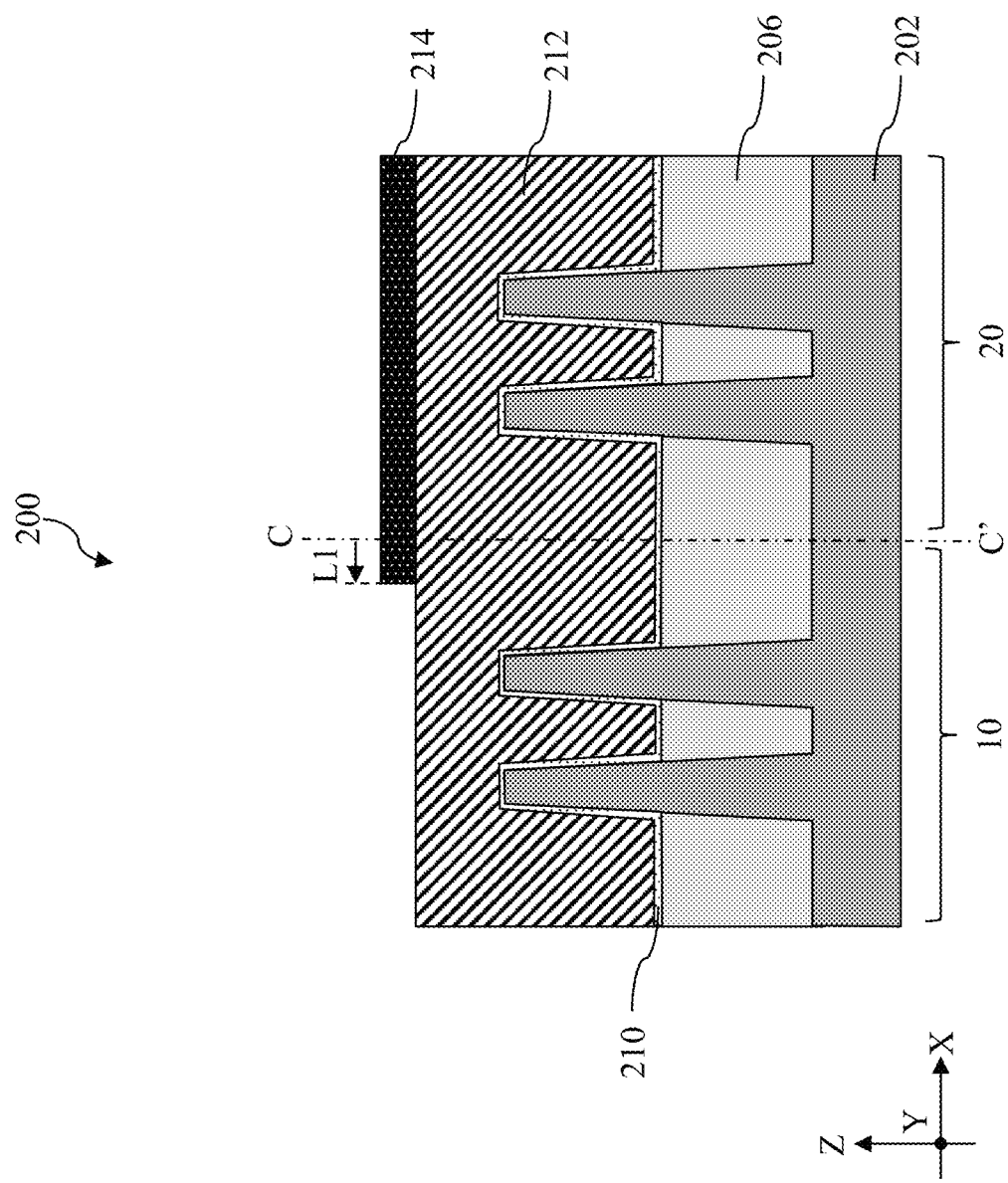
Figure 7:
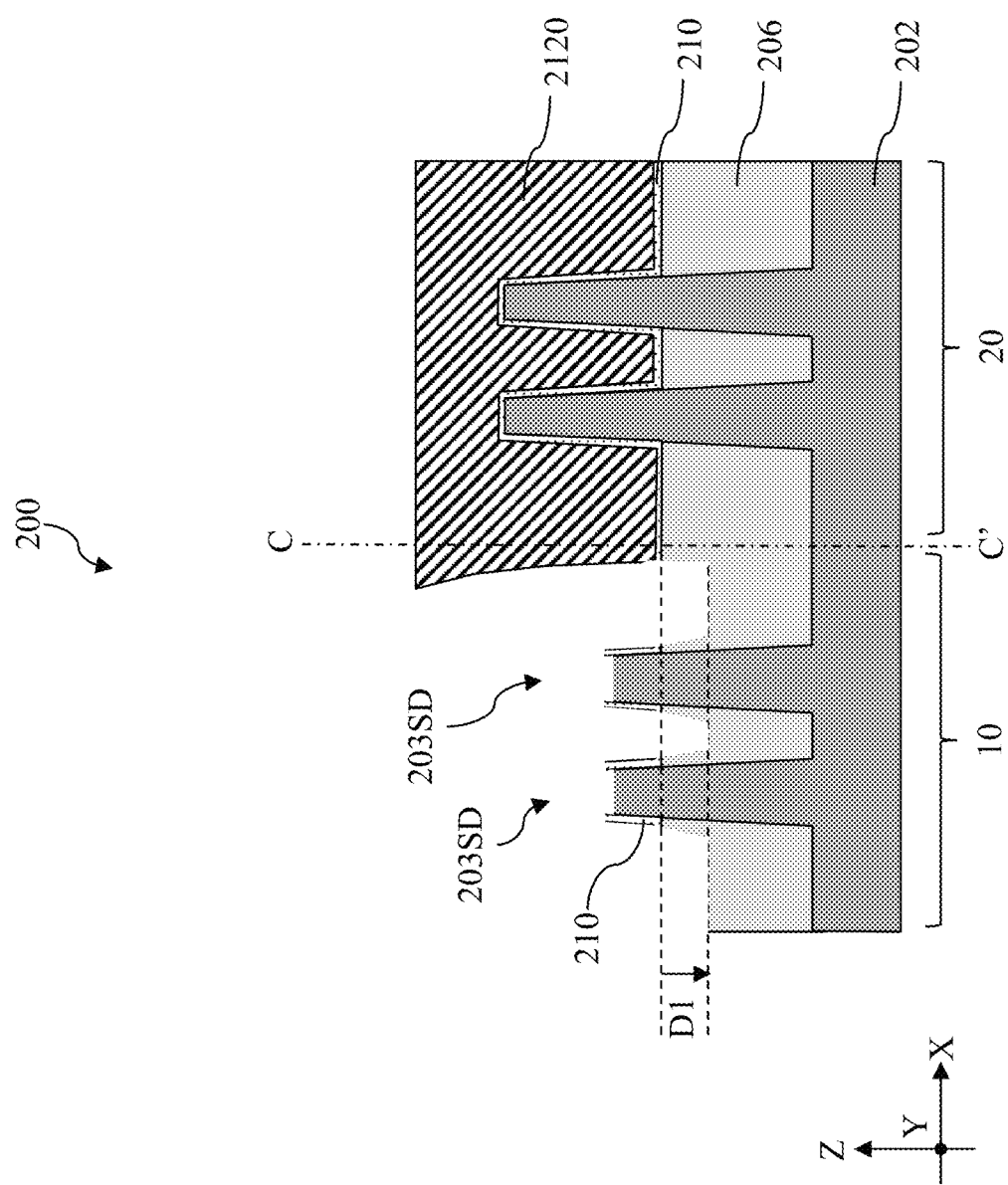

Referring to FIGS. 1, 6 and 7, the method 100 includes a block 110 where a first pattern mask 2120 is formed over the second fins 204. At block 110, in order to form the first pattern mask 2120, a first hard mask layer 212 is first formed over the workpiece 200, as illustrated in FIG. 6. In some embodiments, the first hard mask layer 212 may be a bottom antireflective coating (BARC) layer that includes spin-on carbon (SOC) or a silicon containing polymer, such as polysilazane resin. The first hard mask layer 212 may be deposited over the workpiece 200 using spin-on coating or FCVD. As illustrated in FIG. 6, a first photoresist layer 214 is then deposited over the first hard mask layer 212 and patterned to cover the second fins 204 over the second region 20 while the first fins 203 in the first region is not covered by the patterned first photoresist layer 214. After the first photoresist layer 214 is patterned, the first hard mask layer 212 is etched using the patterned first photoresist layer 214 as an etch mask to form the first pattern mask 2120.

In some embodiments, the etching of the first hard mask layer 212 may be performed using a dry etch process that implements an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. The dry etch process may be performed at an elevated temperature between about 150° C. and about 400° C. to shorten process time and at a bias to improve anisotropic etching. It is observed that the dry etch process may become more isotropic at higher process temperature. That is, the dry etch process may laterally etch the first hard mask layer 212 and the isolation feature 206, resulting in undercutting or a bowling sidewall profile. To remedy this situation, methods of the present disclosure utilize a process temperature about 5° C. to about 20° C. lower, such as between about 130° C. and about 380° C. Alternative, a stronger bias may be applied to enhance directional etching. In some embodiments, a direct current (DC) bias for the dry etch may be between about 0 eV and about 500 eV.

As described above, when the spacing S between a first fin 203 and an adjacent second fin 204 is between about 20 nm and about 100 nm, the GDS layout for patterning the first photoresist layer 214 may be corrected or modified during the OPC process. In the embodiments represented in FIG. 6, when the spacing S is between about 60 nm and about 100 nm and the subsequent etching of the first region 10 is not perfectly anisotropic, the GDS layout is modified such that an edge of the first photoresist layer 214 extends over the center line C-C' into the first region 10 by a first offset L1, as shown in FIG. 6. That way, the first offset L1 may accommodate the amount of undercutting and ensure that the structures being covered by the pattern mask are not damaged. As shown in FIG. 7, along the X direction, a top surface of the first pattern mask 2120 is wider than a bottom surface of the first pattern mask 2120 due to the bowling caused by the undercutting.

Referring to FIGS. 1 and 7, the method 100 includes a block 112 where first source/drain regions 203SD of the first fins 203 are etched using the first pattern mask 2120 as an etch mask. At block 112, the first pattern mask 2120 is applied as an etch mask that protects the second region 20, while the first source/drain regions 203SD of the first fins 203 are recessed and the gate spacer layer 210 over the first source/drain regions 203SD is etched. Operations at block 112 exposes a portion of the first source/drain regions 203SD such that subsequently-forming source/drain features may be formed on exposed surfaces of the first source/drain regions 203SD. In some embodiments, a portion of the gate spacer layer 210 and a portion of the isolation feature 206 may remain disposed along lower sidewalls of the first source/drain regions 203SD. Because deposition of a first source/drain feature 220 (to be described below) is selective to semiconductor surfaces, the gate spacer layer 210 and the isolation feature 206 disposed along sidewalls of the first source/drain regions 203SD help control the growth of the first source/drain features 220. The etching at block 112 also recesses the isolation feature 206 over the first region 10. In some embodiments represented in FIG. 7, the isolation feature 206 over the first region 10 may be vertically recessed by a first depth D1, as compared to a top surface of the isolation feature 206 over the second region 20. In some instances, the first depth D1 may be between about 10 nm and about 25 nm. In the embodiment depicted in FIG. 7, because the first pattern mask 2120 extends past the center line C-C' into the first region 10, the unetched isolation feature 206 also extends past the center line C-C'.

The etching at block 112 may also be performed using a dry etch process. For example, the dry etch process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. After the etch of the first source/drain regions 203SD, the workpiece 200 may undergo a wet clean process to remove debris and oxide from semiconductor surfaces. For example, the wet clean process may include use of standard clean 1 (RCA SC-1, a mixture of deionized (DI) water, ammonium hydroxide, and hydrogen peroxide), standard clean 2 (RCA SC-2, a mixture of DI water, hydrochloric acid, and hydrogen peroxide), SPM (a sulfuric peroxide mixture), and or hydrofluoric acid for oxide removal. Because the wet clean process is essentially a wet clean process, it is isotropic and may extend the bowling or undercutting profile.

Figure 8:
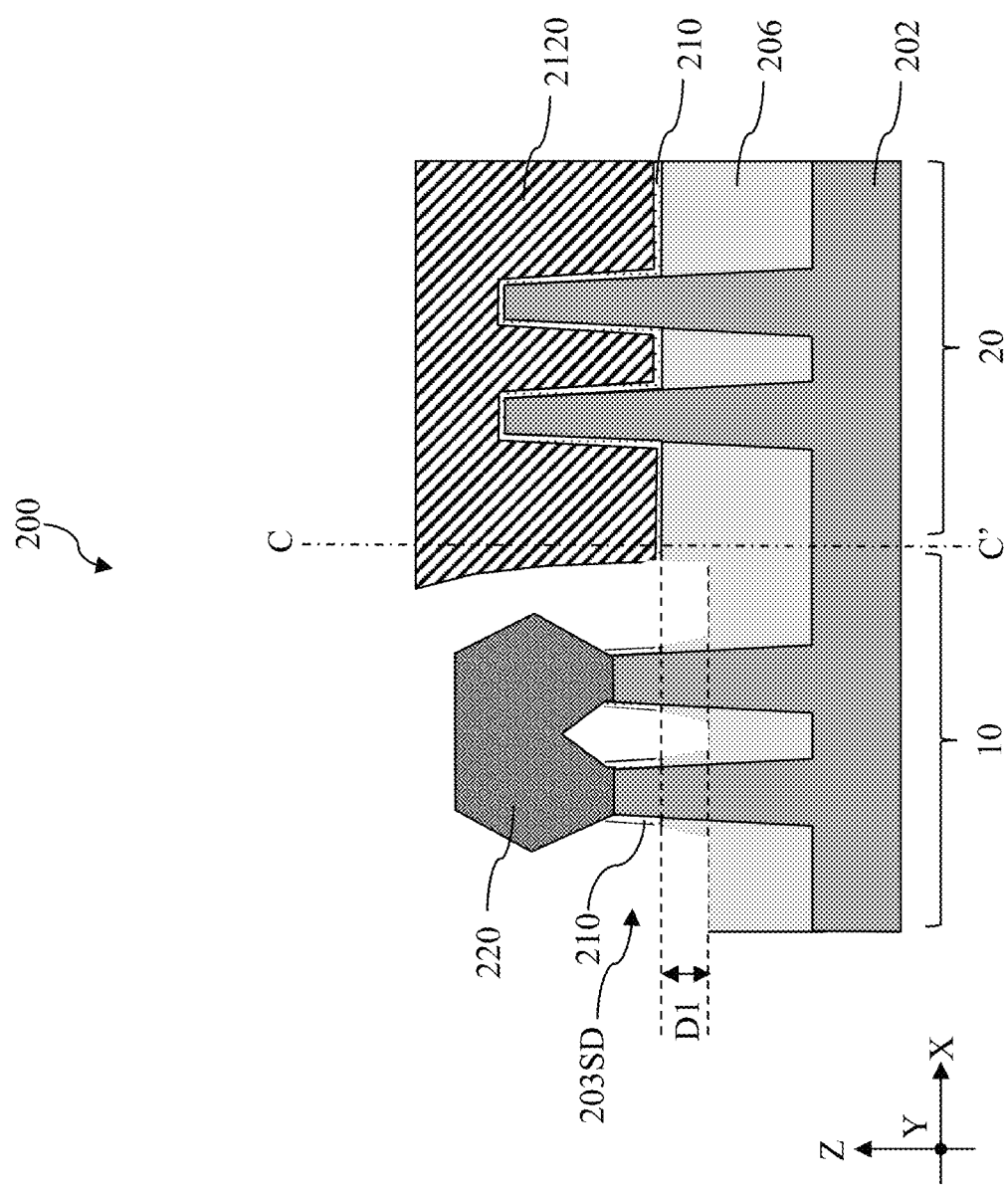

Referring to FIGS. 1 and 8, the method 100 includes a block 114 where a first source/drain feature 220 is formed. In some embodiments, operations at block 114 are configured such that the first source/drain feature 220 is selectively deposited on semiconductor surfaces, such as the exposed portion of the first source/drain regions 203SD. That is, little or no first source/drain feature 220 may be deposited or grow on dielectric surfaces, such as surfaces of the isolation feature 206, the gate spacer layer 210, or the first pattern mask 2120. The first source/drain feature 220 may be an n-type source/drain feature or a p-type source/drain feature. For example, the first source/drain feature 220 may include Ge, Si, GaAs, AlGaAs, SiGe, GaAsP, SiP, or other suitable material and may include an n-type dopant, such as phosphorus (P) or arsenic (As), or a p-type dopant, such as boron (B) or boron difluoride ($BF_2$). In one embodiment, the first source/drain feature 220 is p-type and includes silicon germanium (SiGe) and a p-type dopant, such as boron (B). Suitable epitaxial processes for forming the first source/drain feature 220 include CVD deposition techniques (e.g., vapor-phase epitaxy (VPE) and/or ultra-high vacuum CVD (UHV-CVD)), molecular beam epitaxy (MBE), and/or other suitable processes. The epitaxial growth process may use gaseous and/or liquid precursors, which interact with the composition of the first source/drain regions 203SD. The dopants in the first source/drain feature 220 may be in-situ doped during the epitaxial process by introducing doping species. When the first source/drain feature 220 is not in-situ doped, an implantation process (i.e., a junction implant process) is performed to dope the first source/drain feature 220. While not explicitly shown in the figures, the first source/drain feature 220 may be a multilayer structure. In one example, the first source/drain feature 220 may include a transition epitaxial layer, a heavily doped epitaxial layer over the transition epitaxial layer, and a capping epitaxial layer over the transition epitaxial layer and the heavily doped epitaxial layer. The heavily doped epitaxial layer has the highest dopant concentration among the three sub-layers to reduce contact resistance. The transition epitaxial layer has a dopant concentration lower than that in the heavily doped epitaxial layer to reduce lattice defect density. The capping epitaxial layer, which has a lower dopant concentration than that in the heavily doped epitaxial layer for a higher etch resistance, operates to reduce out-diffusion of dopants in the heavily doped epitaxial layer. In one example where the first source/drain feature 220 is a multilayer structure, its transition epitaxial layer, heavily doped epitaxial layer, and the capping epitaxial layer are formed of silicon germanium (SiGe) and are doped with boron (B).

After the formation of the first source/drain feature 220, the first pattern mask 2120 is selectively removed by ashing or selective etching. Removal of the first pattern mask 2120 is configured such that the damages to the first source/drain feature 220 are minimized. It can be seen that the first pattern mask 2120 shown in FIG. 8 is no longer present in FIG. 9.

Figure 9:
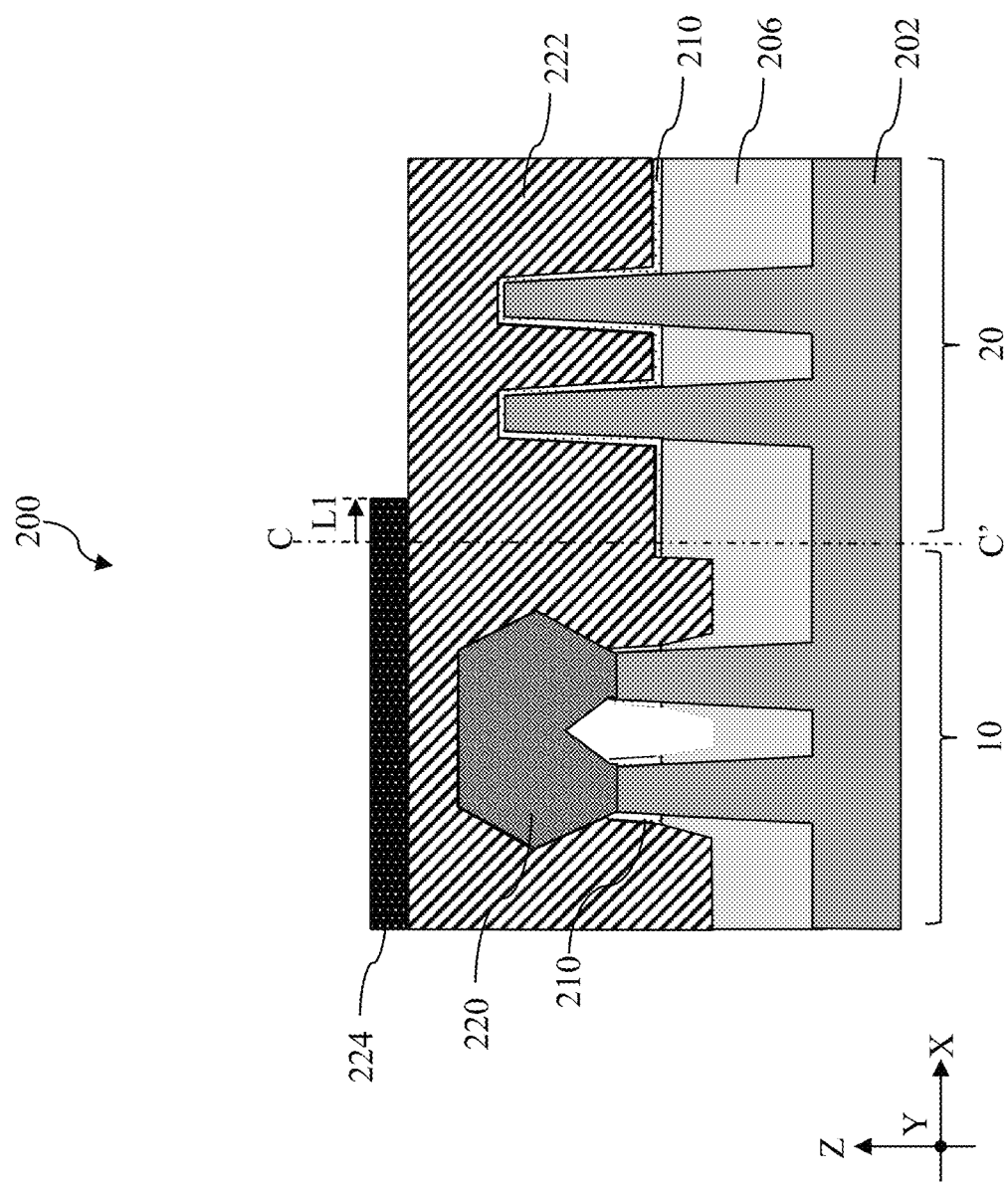
Figure 10:
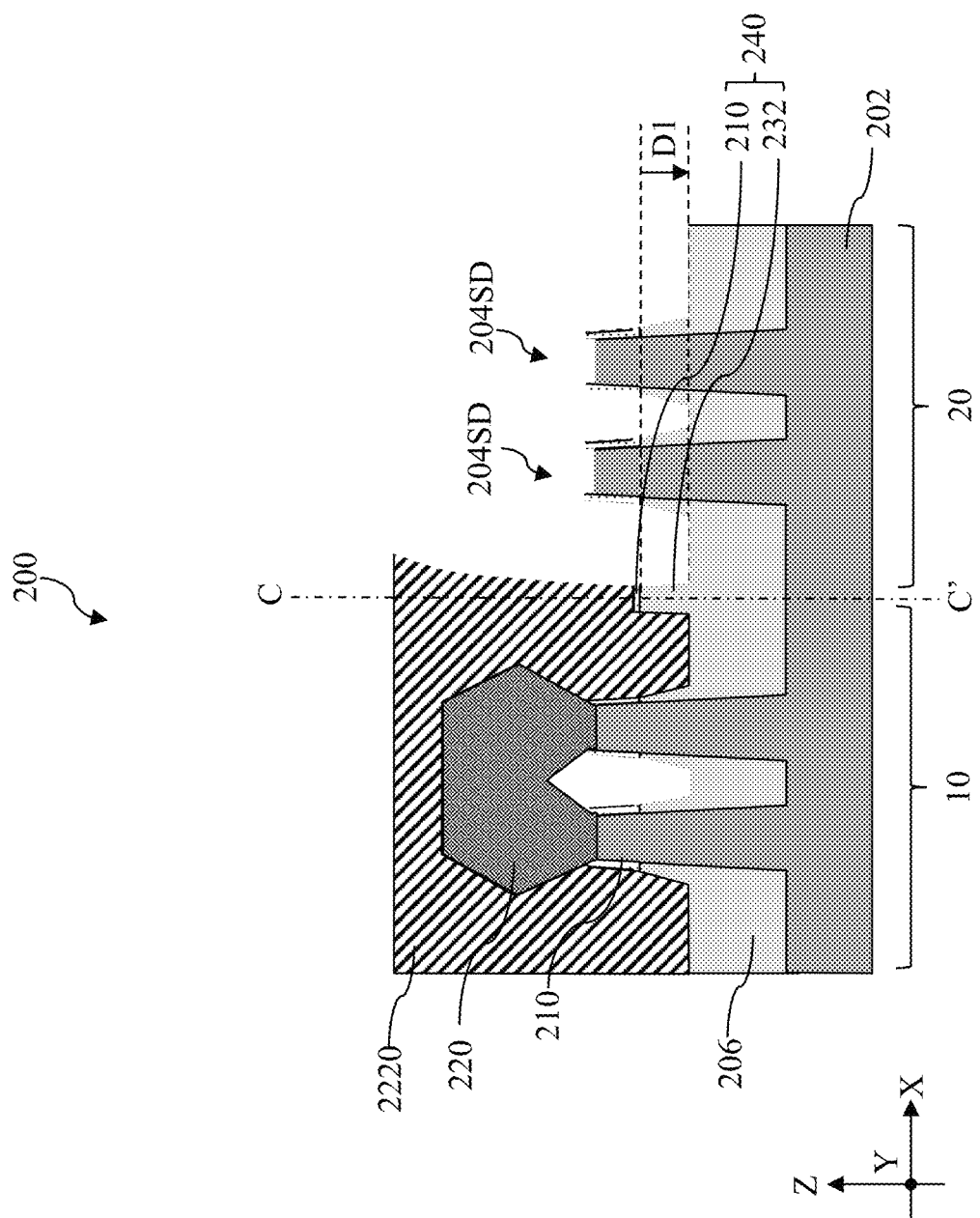

Referring to FIGS. 1, 9 and 10, the method 100 includes a block 116 where a second pattern mask 2220 is formed over the first source/drain features 220. At block 116, in order to form the second pattern mask 2220, a second hard mask layer 222 is first formed over the workpiece 200, as illustrated in FIG. 9. In some embodiments, the second hard mask layer 222 may be a bottom antireflective coating (BARC) layer that includes spin-on carbon (SOC) or a silicon containing polymer, such as polysilazane resin. The second hard mask layer 222 may be deposited over the workpiece 200 using spin-on coating or FCVD. As illustrated in FIG. 9, a second photoresist layer 224 is then deposited and patterned to cover the first source/drain feature 220 over the first region 10 while the second fins 204 in the second region 20 is not covered by the patterned second photoresist layer 224. After the second photoresist layer 224 is patterned, the second hard mask layer 222 is etched using the patterned second photoresist layer 224 as an etch mask to form the second pattern mask 2220.

In some embodiments, the etching of the second hard mask layer 222 may be performed using a dry etch process that implements an oxygen-containing gas, a fluorine-containing gas (e.g., $CF_4$, $SF_6$, $CH_2F_2$, $CHF_3$, and/or $C_2F_6$), a chlorine-containing gas (e.g., $C_{12}$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. The dry etch process may be performed at an elevated temperature between about 150° C. and about 400° C. to shorten process time and at a bias to improve anisotropic etching. It is observed that the dry etch process may become more isotropic at higher process temperature. That is, the dry etch process may laterally etch the second hard mask layer 222 and the isolation feature 206, resulting in undercutting or a bowling sidewall profile. To remedy this situation, methods of the present disclosure utilize a process temperature about 5° C. to about 20° C. lower, such as between about 130° C. and about 380° C. Alternative, a stronger bias may be applied to enhance directional etching. In some embodiments, a direct current (DC) bias for the dry etch may be between about 0 eV and about 500 eV.

As described above, when the spacing S between a first fin 203 and an adjacent second fin 204 is between about 20 nm and about 100 nm, the GDS layout for patterning the second photoresist layer 224 may be corrected or modified during the OPC process. In the embodiments represented in FIG. 9, when the spacing S is between about 60 nm and about 100 nm and the subsequent etching of the second region 20 is not perfectly anisotropic, the GDS layout is modified such that an edge of the second photoresist layer 224 extends over the center line C-C' into the second region 20 by the first offset L1, as shown in FIG. 9. That way, the first offset L1 may accommodate the amount of undercutting and ensure that the structures being covered by the pattern mask are not damaged. As shown in FIG. 10, along the X direction, a top surface of the second pattern mask 2220 is wider than a bottom surface of the second pattern mask 2220 due to the bowling caused by the undercutting.

Referring to FIGS. 1 and 10, the method 100 includes a block 118 where source/drain regions of the second fins 204 are etched using the second pattern mask 2220 as an etch mask. At block 118, the second pattern mask 2220 is applied as an etch mask that protects the first source/drain feature 220 in the first region 10, while the second source/drain regions 204SD of the second fins 204 are etched to remove the gate spacer layer 210. Operations at block 118 exposes a portion of the second source/drain regions 204SD such that a second source/drain feature 230 (to be described below) may be formed on exposed surfaces of the second source/drain regions 204SD. In some embodiments, a portion of the gate spacer layer 210 and a portion of the isolation feature 206 may remain disposed along lower sidewalls of the second source/drain regions 204SD. Because deposition of the second source/drain feature 230 (to be described below) is selective to semiconductor surfaces, the gate spacer layer 210 and the isolation feature 206 disposed along sidewalls of the second source/drain regions 204SD help control the growth of the second source/drain features 230. To ensure satisfactory removal of the gate spacer layer 210 from the second source/drain regions 204SD, the etching at block 118 may also recess the isolation feature 206 over the second region 20. In some embodiments represented in FIG. 10, the isolation feature 206 over the second region 20 may be vertically recessed by substantially the same first depth D1. In the embodiment depicted in FIG. 10, because the second pattern mask 2220 extends past the center line C-C' into the second region 20, the unetched isolation feature 206 also extends past the center line C-C'. In some embodiment represented in FIG. 10, a portion of the isolation feature 206 along the center line C-C', along with the gate spacer layer 210 on top of it, may remain unetched at blocks 112 and 118. As a result, a ridge 240 may be formed at the junction of the first region 10 and the second region 20. The ridge 240 is a localized protrusion on the isolation feature 206 near or around the center line C-C'. The ridge 240 include a bottom portion 232 formed from the isolation feature 206 and a top portion formed from the gate spacer layer 210.

The etching at block 118 may also be performed using a dry etch process. For example, the dry etch process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. After the etch of the second source/drain regions 204SD, the workpiece 200 may undergo a wet clean process to remove debris and oxide from semiconductor surfaces. For example, the wet clean process may include use of standard clean 1 (RCA SC-1, a mixture of deionized (DI) water, ammonium hydroxide, and hydrogen peroxide), standard clean 2 (RCA SC-2, a mixture of DI water, hydrochloric acid, and hydrogen peroxide), SPM (a sulfuric peroxide mixture), and or hydrofluoric acid for oxide removal. Because the wet clean process is essentially a wet clean process, it is isotropic and may extend the bowling or undercutting profile. The wet clean process may reduce the top portion of the ridge 240 but may not completely remove the top portion of the ridge 240, which is formed from the gate spacer layer 210 and may include silicon oxycarbonitride.

Figure 11:
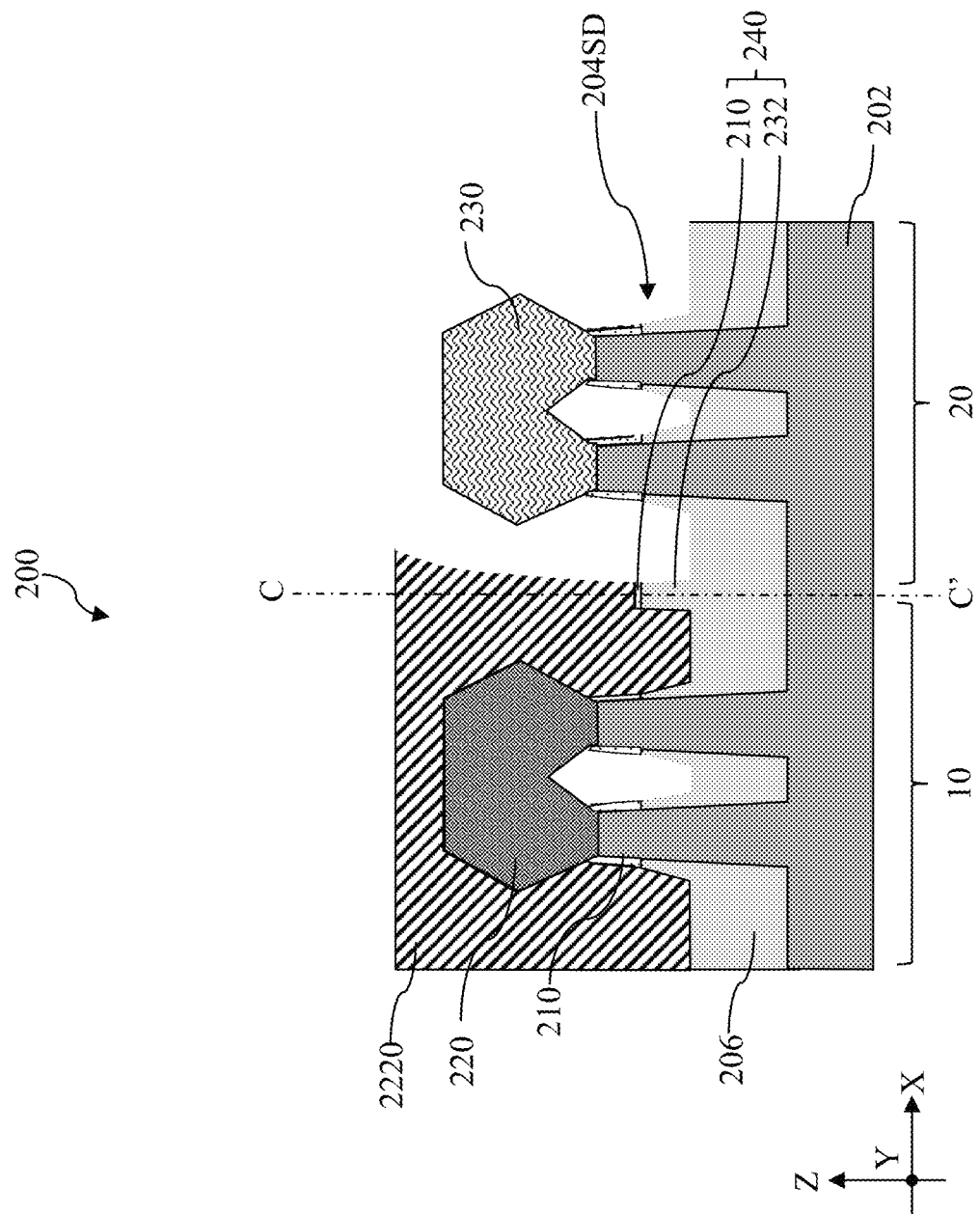

Referring to FIGS. 1 and 11, the method 100 includes a block 120 where a second source/drain feature 230 is formed. In some embodiments, operations at block 120 are configured such that the second source/drain feature 230 is selectively deposited on semiconductor surfaces, such as the exposed portion of the second source/drain regions 204SD. That is, little or no second source/drain feature 230 may be deposited or grow on dielectric surfaces, such as surfaces of the isolation feature 206, the gate spacer layer 210, or the second pattern mask 2220. The second source/drain feature 230 may be an n-type source/drain feature or a p-type source/drain feature. For example, the second source/drain feature 230 may include Ge, Si, GaAs, AlGaAs, SiGe, GaAsP, SiP, or other suitable material and may include an n-type dopant, such as phosphorus (P) or arsenic (As), or a p-type dopant, such as boron (B) or boron difluoride ($BF_2$). In one embodiment, the second source/drain feature 230 is n-type and includes silicon (Si) and an n-type dopant, such as phosphorus (P). Suitable epitaxial processes for forming the second source/drain feature 230 include CVD deposition techniques (e.g., vapor-phase epitaxy (VPE) and/or ultra-high vacuum CVD (UHV-CVD)), molecular beam epitaxy (MBE), and/or other suitable processes. The epitaxial growth process may use gaseous and/or liquid precursors, which interact with the composition of the second source/drain regions 204SD. The dopants in the second source/drain feature 230 may be in-situ doped during the epitaxial process by introducing doping species. When the second source/drain feature 230 is not in-situ doped, an implantation process (i.e., a junction implant process) is performed to dope the second source/drain feature 230. While not explicitly shown in the figures, the second source/drain feature 230 may be a multilayer structure. In one example, the second source/drain feature 230 may include a transition epitaxial layer, a heavily doped epitaxial layer over the transition epitaxial layer, and a capping epitaxial layer over the transition epitaxial layer and the heavily doped epitaxial layer. The heavily doped epitaxial layer has the highest dopant concentration among the three sub-layers to reduce contact resistance. The transition epitaxial layer has a dopant concentration lower than that in the heavily doped epitaxial layer to reduce lattice defect density. The capping epitaxial layer, which has a lower dopant concentration than that in the heavily doped epitaxial layer, operates to reduce out-diffusion of dopants in the heavily doped epitaxial layer. In one example where the second source/drain feature 230 has a multilayer structure, its transition epitaxial layer, heavily doped epitaxial layer, and the capping epitaxial layer are formed of silicon (Si) and are doped with phosphorus (P).

Figure 12:
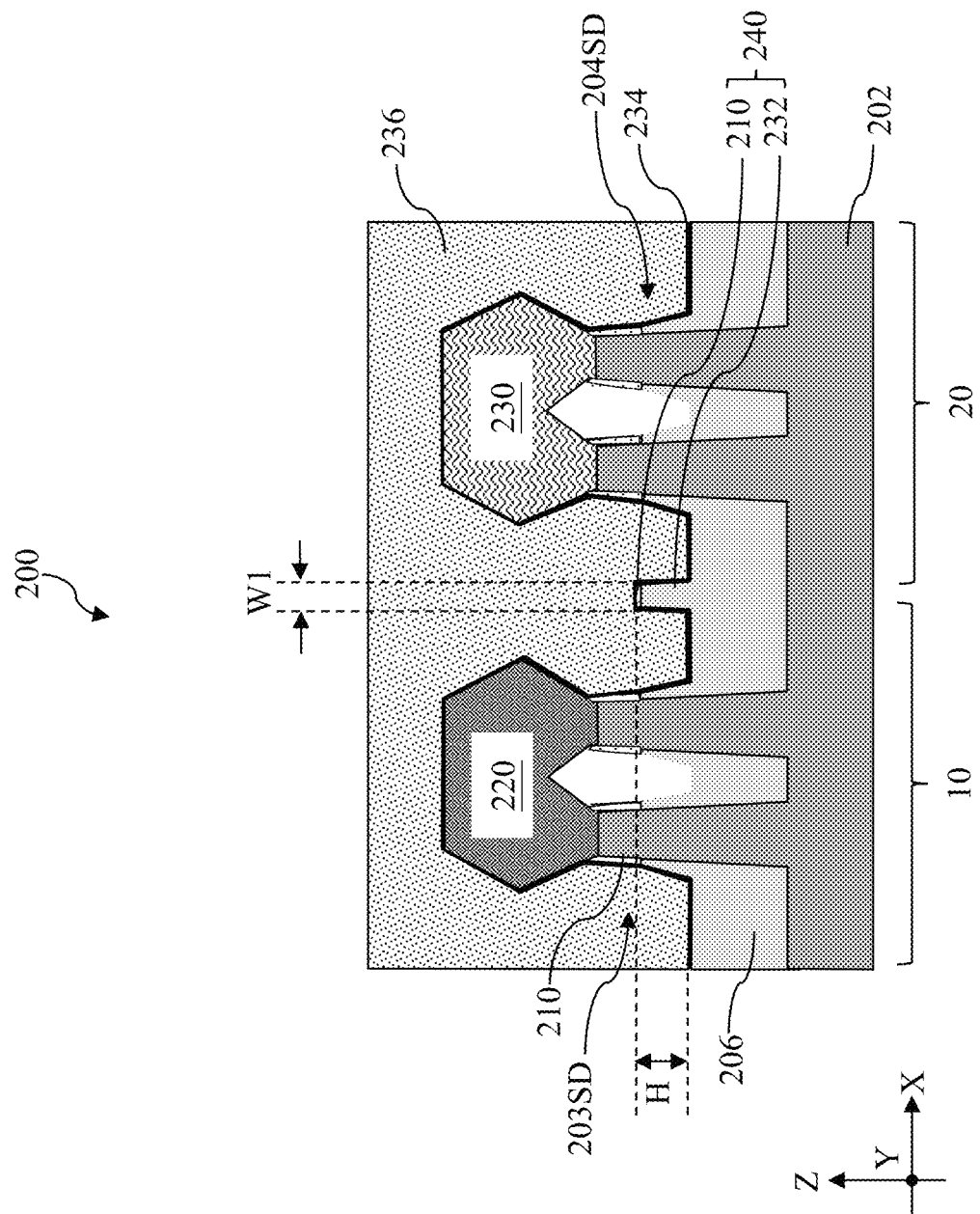

Referring to FIGS. 1 and 12, the method 100 includes a block 122 where further processes are performed. Such further processes may include deposition of a contact etch stop layer (CESL) 234 over the workpiece 200, deposition of an interlayer dielectric (ILD) layer 236 over the CESL 234, and replacement of the dummy gate stack 208 with a metal gate structure. In some examples, the CESL 234 may include silicon nitride or other materials known in the art. The CESL 234 may be formed by ALD, plasma-enhanced chemical vapor deposition (PECVD) process and/or other suitable deposition or oxidation processes. In some embodiments, the ILD layer 236 may include tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 236 may be deposited by PECVD, FCVD, spin-on coating, or a suitable deposition technique. In some embodiments, after formation of the ILD layer 236, the workpiece 200 may be annealed to improve integrity of the ILD layer 236.

After the deposition of the ILD layer 236, a planarization process may be performed to remove excessive dielectric materials. For example, a planarization process includes a chemical mechanical planarization (CMP) process which removes portions of the ILD layer 236 overlying the dummy gate stack 208 and planarizes a top surface of the workpiece 200. With the dummy gate stack 208 exposed, one or more etch processes are performed to selectively remove the dummy gate stack 208 without substantially etching the gate spacer layer 210 disposed along sidewalls of the dummy gate stack 208. The removal of the dummy gate stack 208 produces a gate trench defined by the gate spacer layer 210. A metal gate structure may be subsequently formed in the gate trench. The metal gate structure may include an interfacial layer, a gate dielectric layer over the interfacial layer, and a gate electrode layer formed over the gate dielectric layer.

The interfacial layer of the metal gate structure may include a dielectric material such as silicon oxide, hafnium silicate, or silicon oxynitride. The interfacial layer may be formed by chemical oxidation, thermal oxidation, atomic layer deposition (ALD), chemical vapor deposition (CVD), and/or other suitable method. The gate dielectric layer may include a high-K dielectric layer such as hafnium oxide. Alternatively, the gate dielectric layer may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The high-K gate dielectric layer may be formed by ALD, physical vapor deposition (PVD), CVD, oxidation, and/or other suitable methods. Here, high-K gate dielectrics, as used and described herein, include dielectric materials having a high dielectric constant, for example, greater than that of thermal silicon oxide (~3.9).

The gate electrode layer may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode layer may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. In various embodiments, the gate electrode layer may be formed by ALD, PVD, CVD, e-beam evaporation, or other suitable process.

Reference is still made to FIG. 12. In embodiments where the ridge 240 is formed, the contact etch stop layer 234 formed at block 122 is in direct contact with sidewalls of the bottom portion 232 of the ridge 240, which is formed of the isolation feature 206. The top surface of the bottom portion 232 of the ridge 240 may be at least partially covered by the top portion, which is formed of the gate spacer layer 210. In the depicted embodiments, at least a portion of the top surface of the bottom portion 232 is spaced apart from the CESL 234 by the top portion, which is formed of the gate spacer layer 210. When the CESL 234 is formed of silicon nitride, the isolation feature 206 is formed of silicon oxide and the gate spacer layer 210 is formed of silicon oxycarbonitride, the presence of the top portion of the ridge 240 may be identified by detection of carbon (C), which is not found in the CESL 234 or the isolation feature 206. The ridge 240, including the top portion and the bottom portion 232, has a height H along the Z direction and a first width W1 along the X direction. The height H may be between about 10 nm and about 30 nm and the first width W1 may be between about 10% and about 30% of the spacing S. This range is not trivial. When the first width W1 is smaller than 10% of the spacing S, the resulting ridge 240 would not have sufficient material to withstand the subsequent wet clean process. When the first width W1 is greater than 30% of the spacing S, the resulting ridge 240 would be so wide and rounded that it simply blends in with the isolation feature 206. As shown in FIG. 12, the ridge 240 extends upward into the ILD layer 236 and is disposed between a first source/drain region 203SD and an adjacent second source/drain region 204SD.

The first pattern mask 2120 and the second pattern mask 2220 may have different coverage with respect to the center line C-C', leading to alternative embodiments. FIGS. 13-19 illustrate a first alternative embodiment and FIGS. 20-25 illustrate a second alternative embodiments. The different coverage may be implemented by different OPC modification of the GDS layout.

Figure 13:
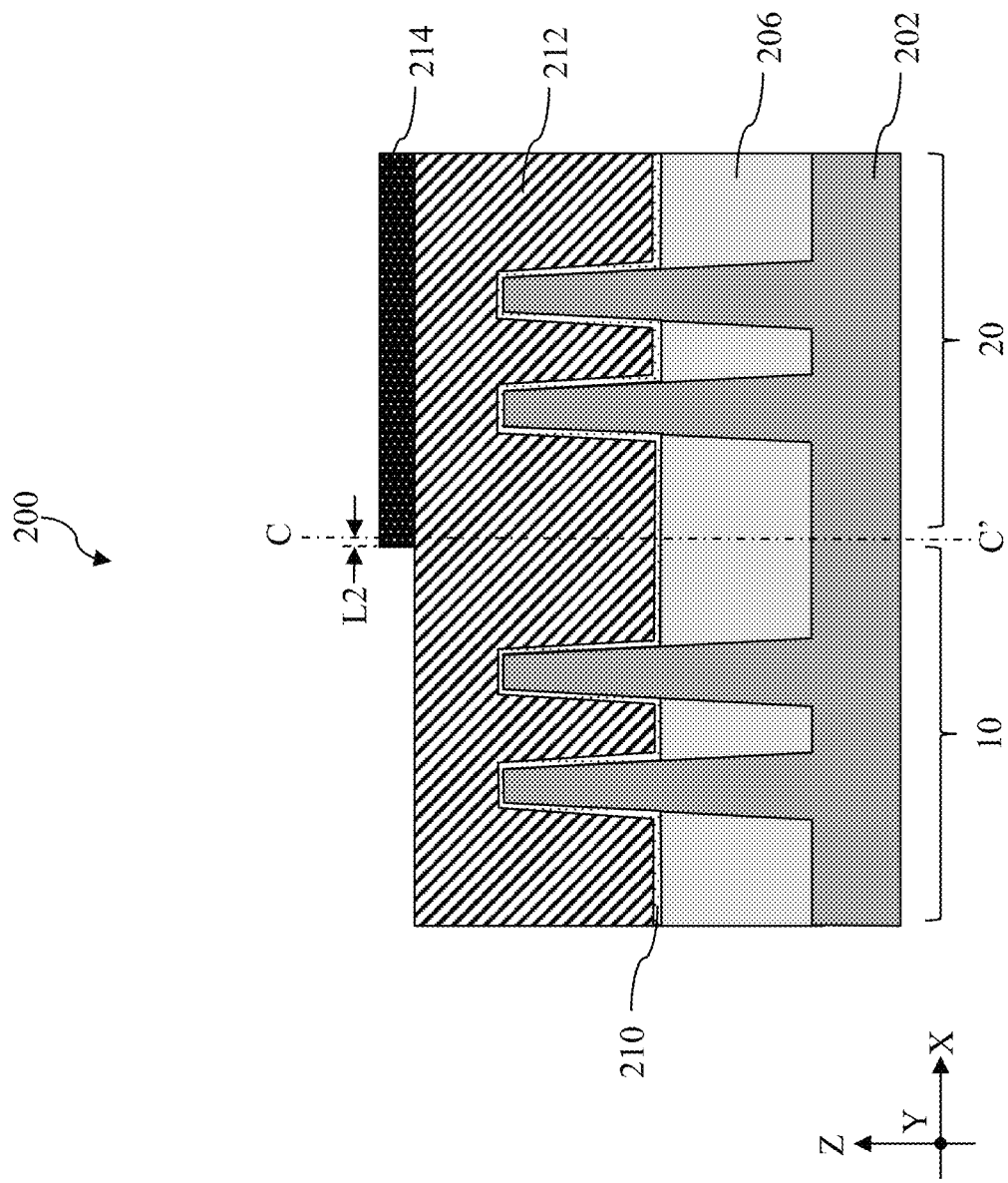
Figure 14:
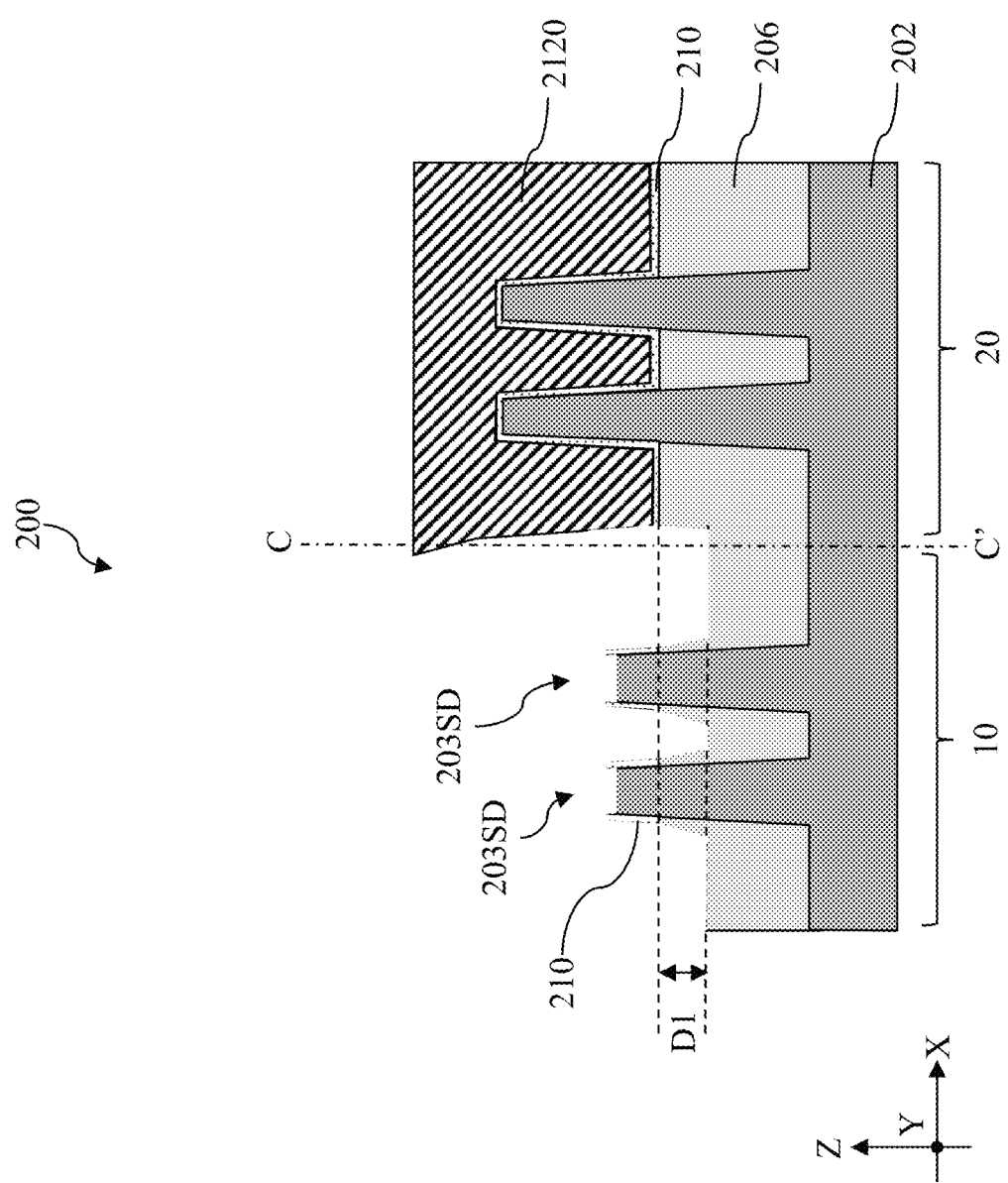
Figure 15:
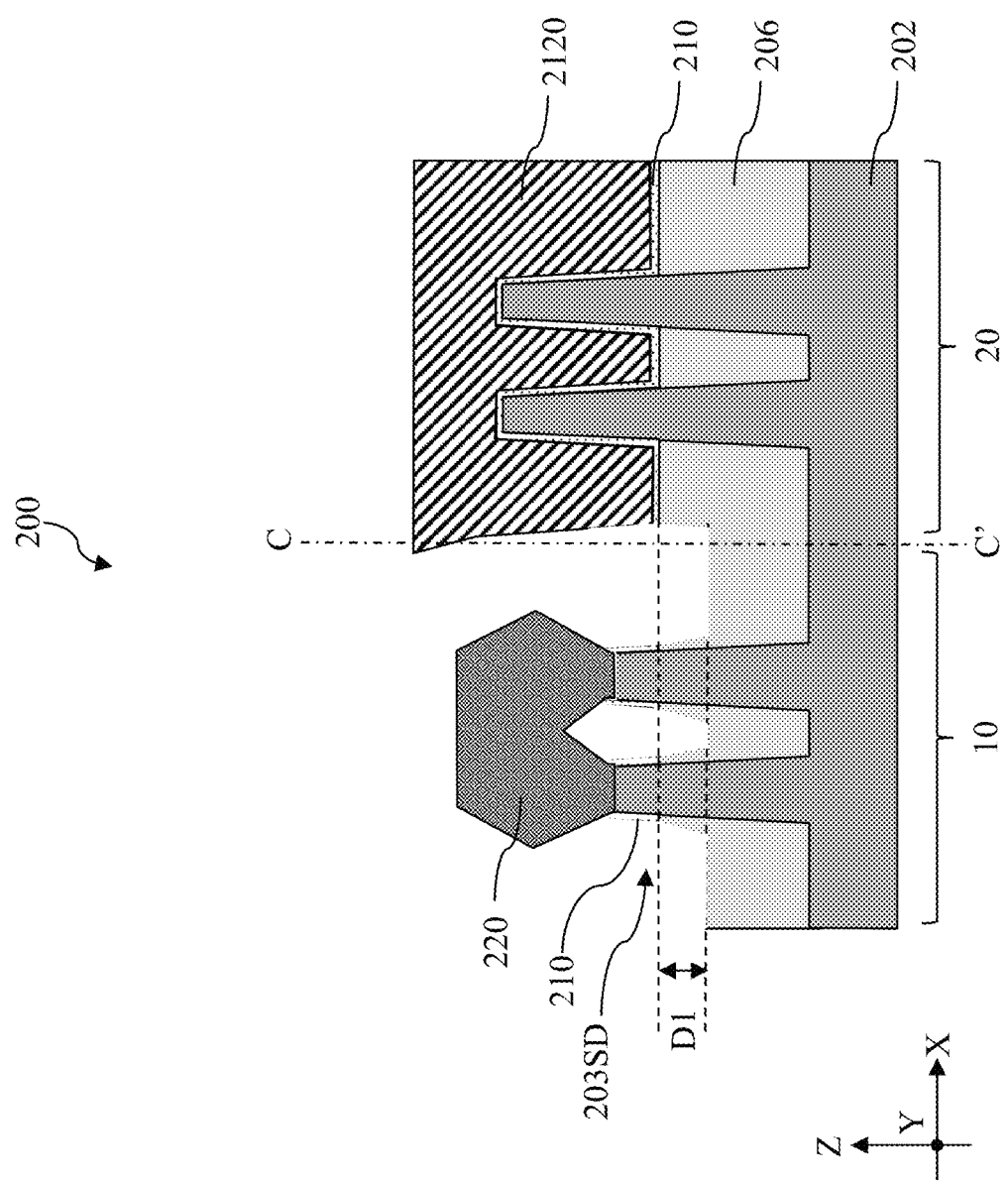
Figure 16:
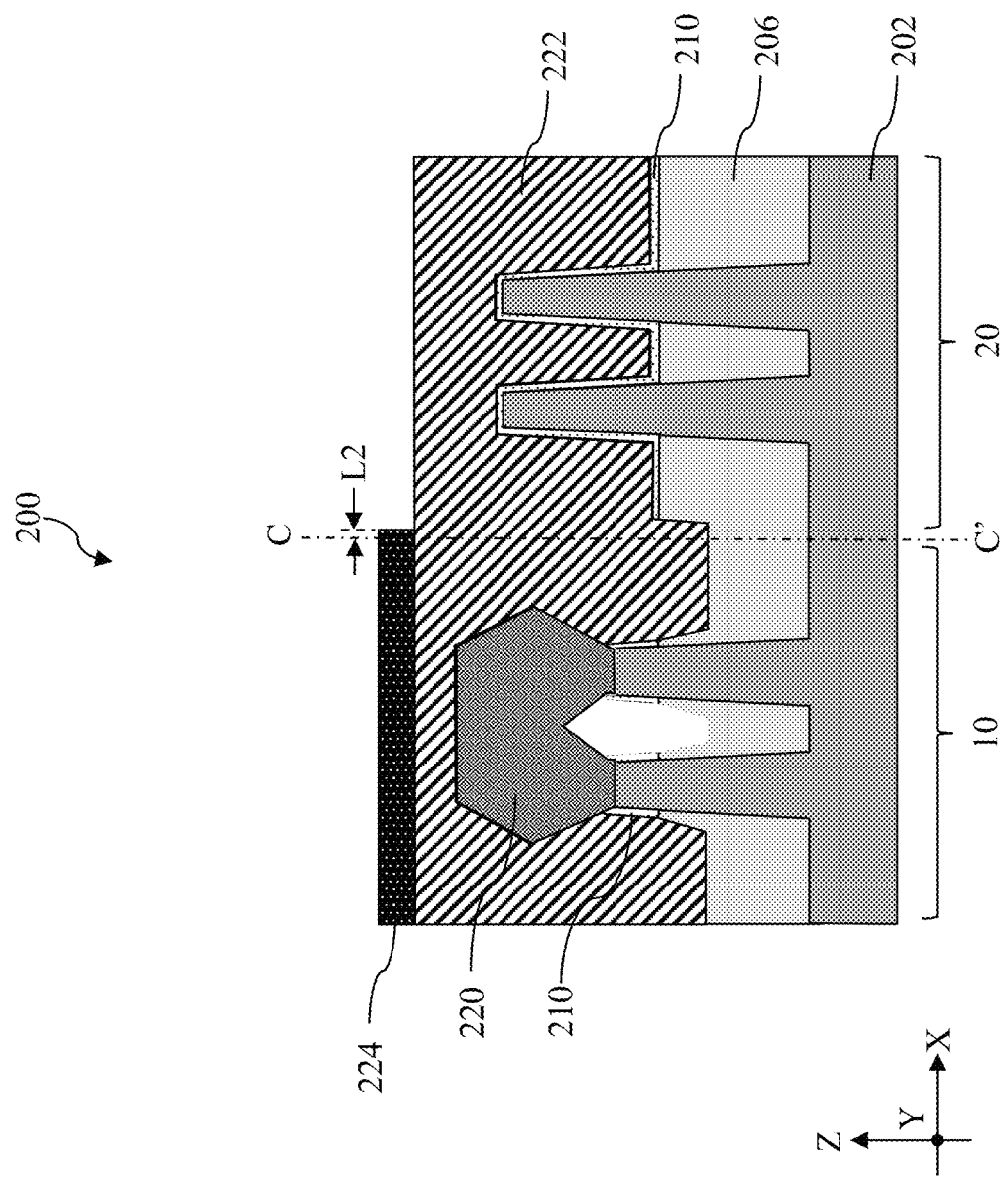
Figure 17:
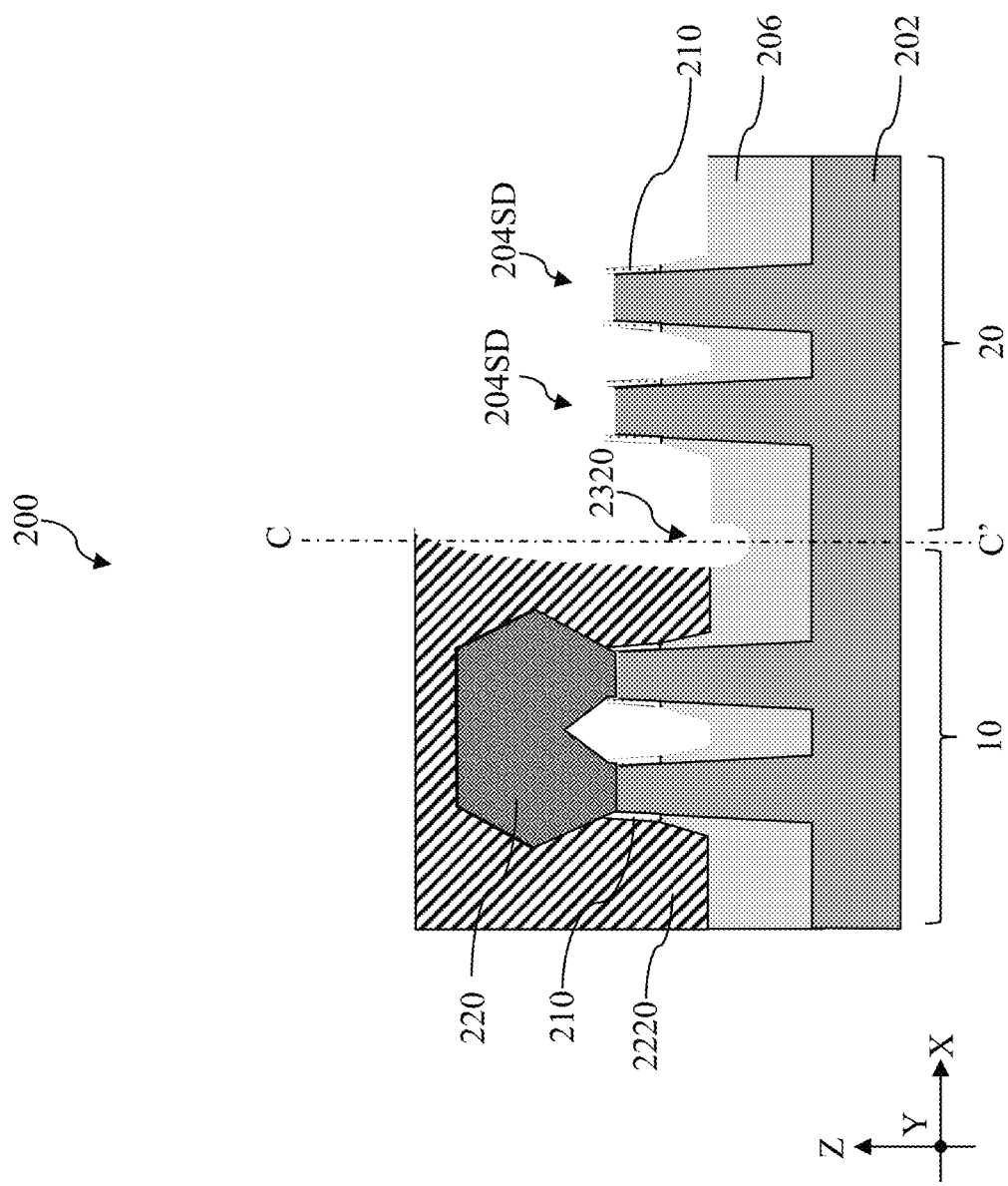
Figure 18:
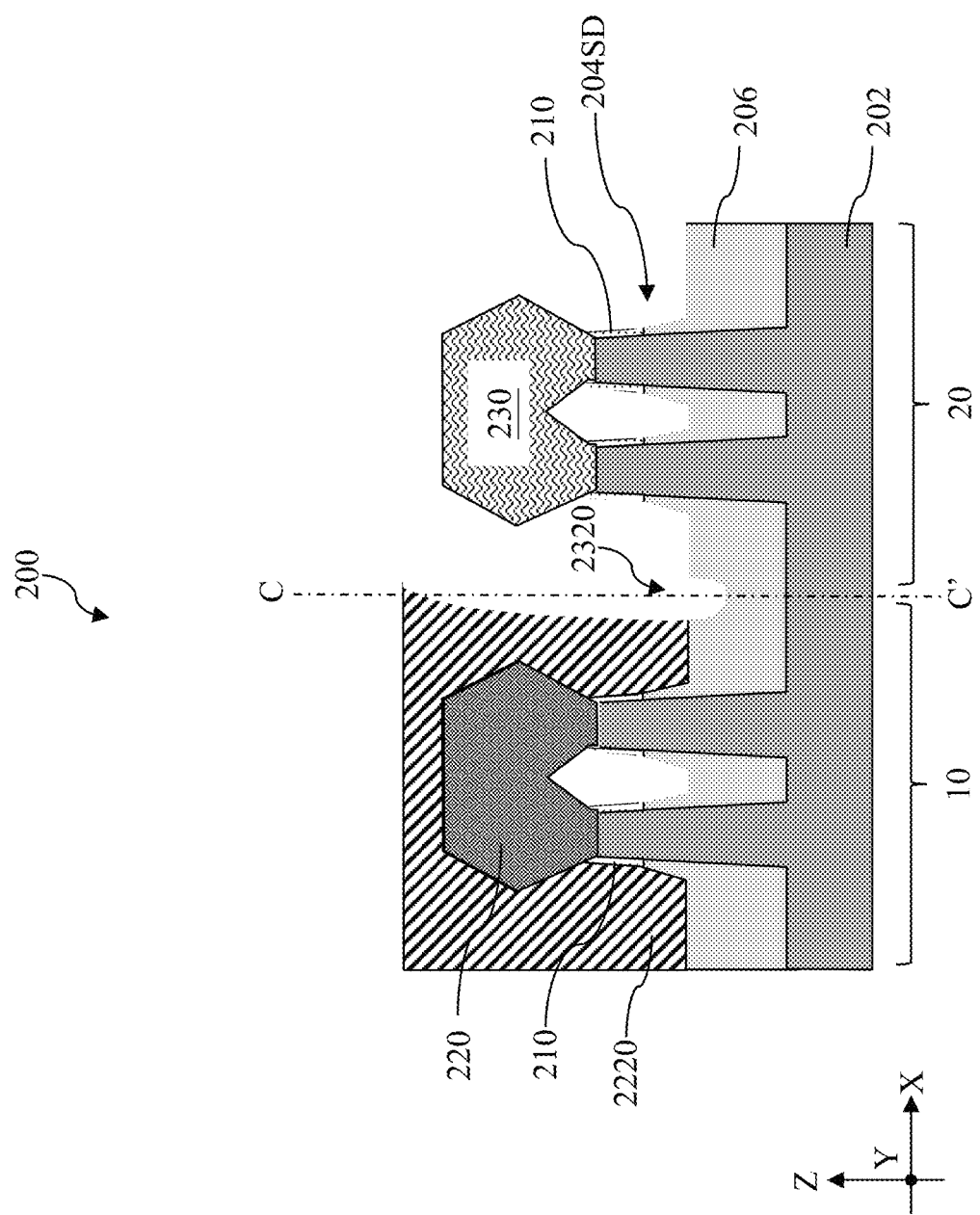
Figure 19:
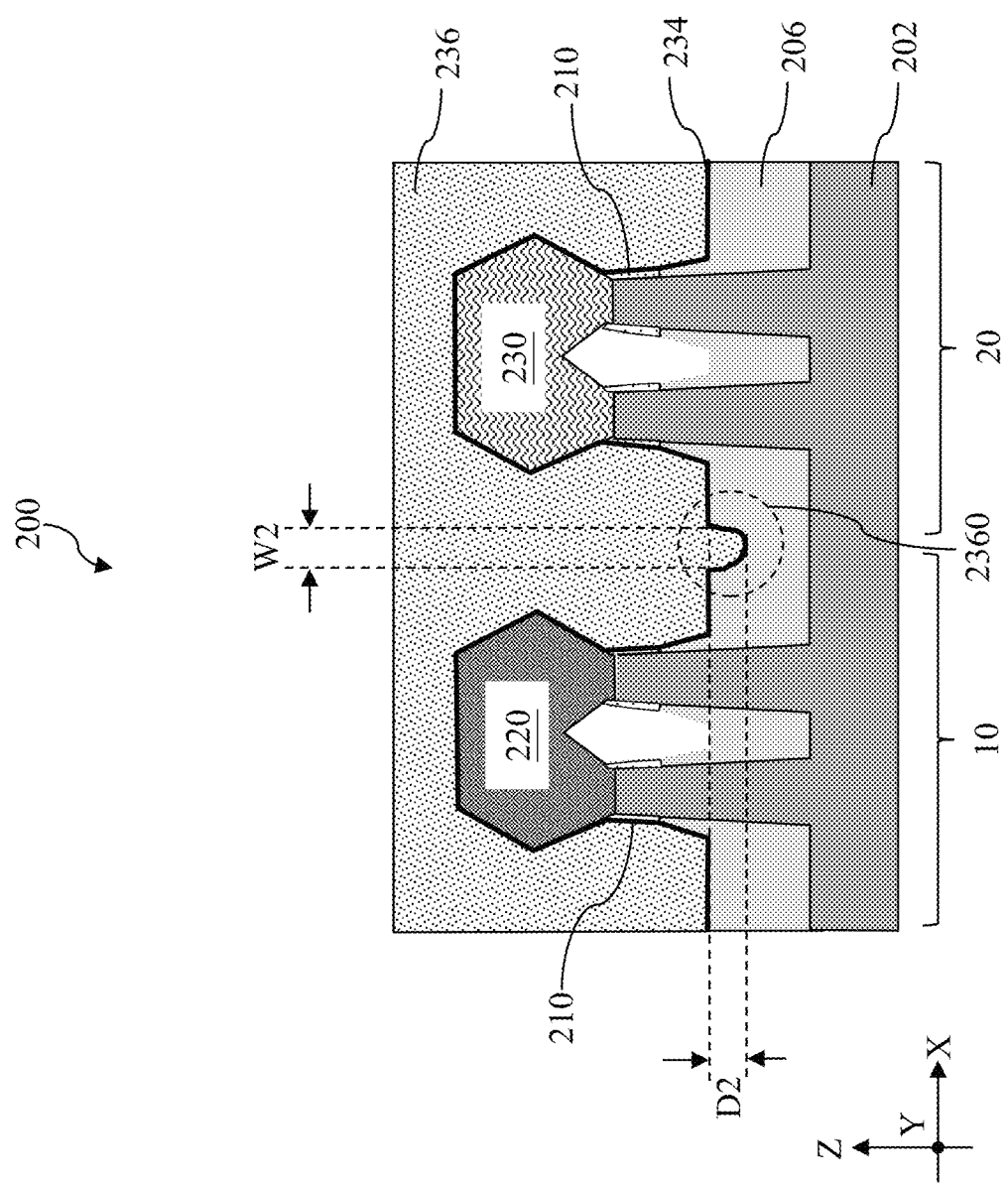

The first alternative embodiment may be implemented when the spacing S is between about 20 nm and about 60 nm. When the spacing S falls into this range, the isolation feature 206 near or around the center line C-C' will be etched twice, even with the OPC modification. Referring to FIG. 13, in the first alternative embodiment, the first photoresist layer 214 formed at block 110 may extend past the center line C-C' by a second offset L2 smaller than the first offset L1. As a result, a bottom edge of the first pattern mask 2120 does not extend over the first region 10, as shown in FIG. 14 and the isolation feature 206 near or around the center line C-C' is etched at block 112 of method 100. After the first region 10 is etched to partially remove the gate spacer layer 210, the first source/drain feature 220 is formed over the first source/drain regions 203SD, as shown in FIG. 15. Referring to FIG. 16, the second photoresist layer 224 formed at block 116 extends past the center line C-C' by the same second offset L2. As a result, a bottom edge of the second pattern mask 2220 also does not extend over the second region 20, as shown in FIG. 17 and the isolation feature 206 near or around the center line C-C' is etched again at block 118 of method 100. Because the isolation feature 206 near or around the center line C-C' is recessed twice in the first alternative embodiment, a trench 2320 may be formed in the isolation feature 206. In some instances, the trench 2320 may be substantially aligned with the center line C-C'. After the second source/drain feature 230 is formed over the second region 20 as shown in FIG. 18, the CESL 234 and the ILD layer 236 are deposited over the first source/drain feature 220 and the second source/drain feature 230. As illustrated in FIG. 19, both the CESL 234 and the ILD layer 236 may be deposited into the trench 2320. In some embodiments, the CESL 234 is disposed on surfaces of the trench 230 and the ILD layer 236 fills the rest of the space in the trench 2320. Put differently, a portion of the CESL 234 and a portion of the ILD layer 236 extend into the trench 2320 to form a plug 2360, shown in FIG. 19.

Figure 20:
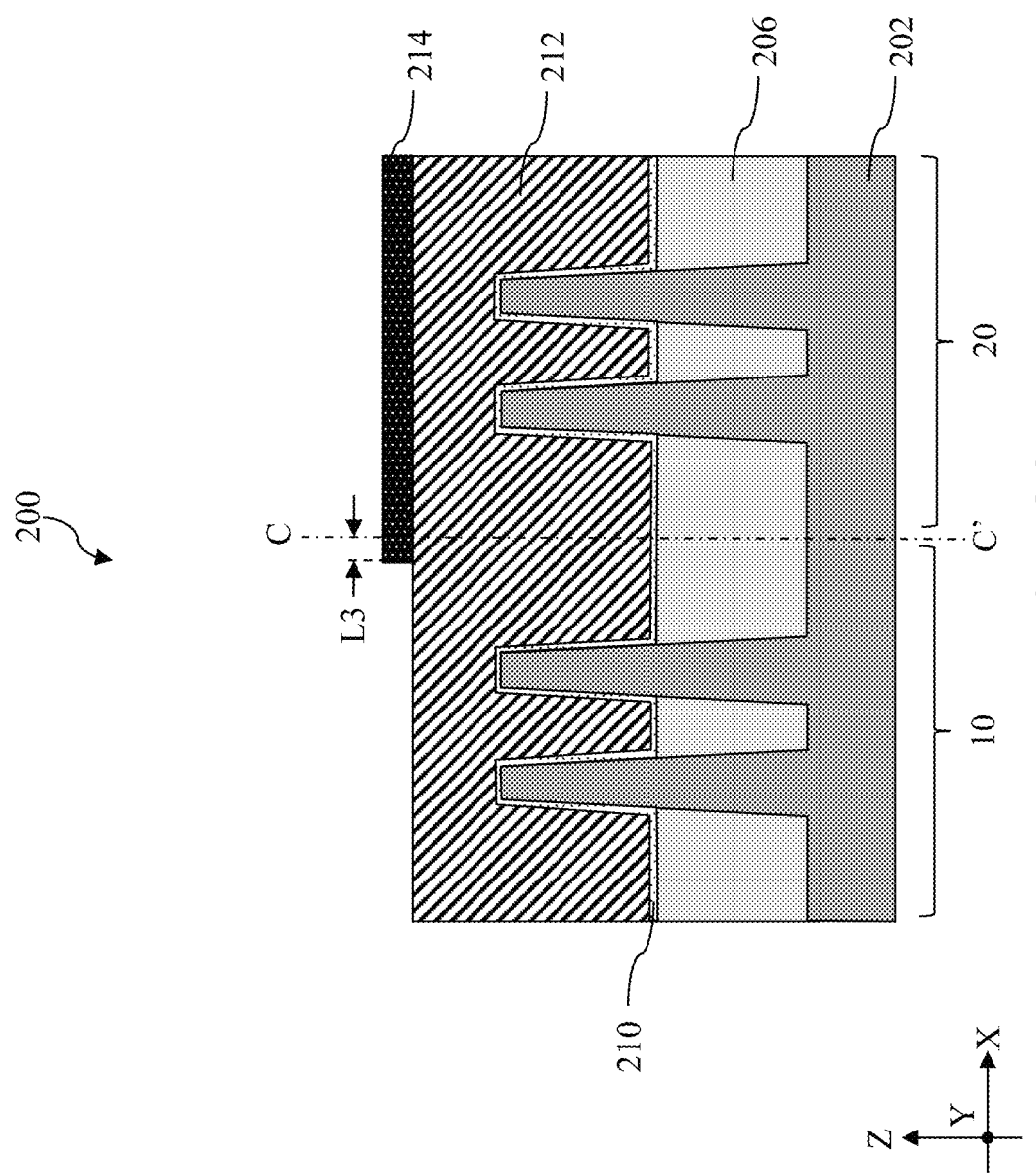
Figure 21:
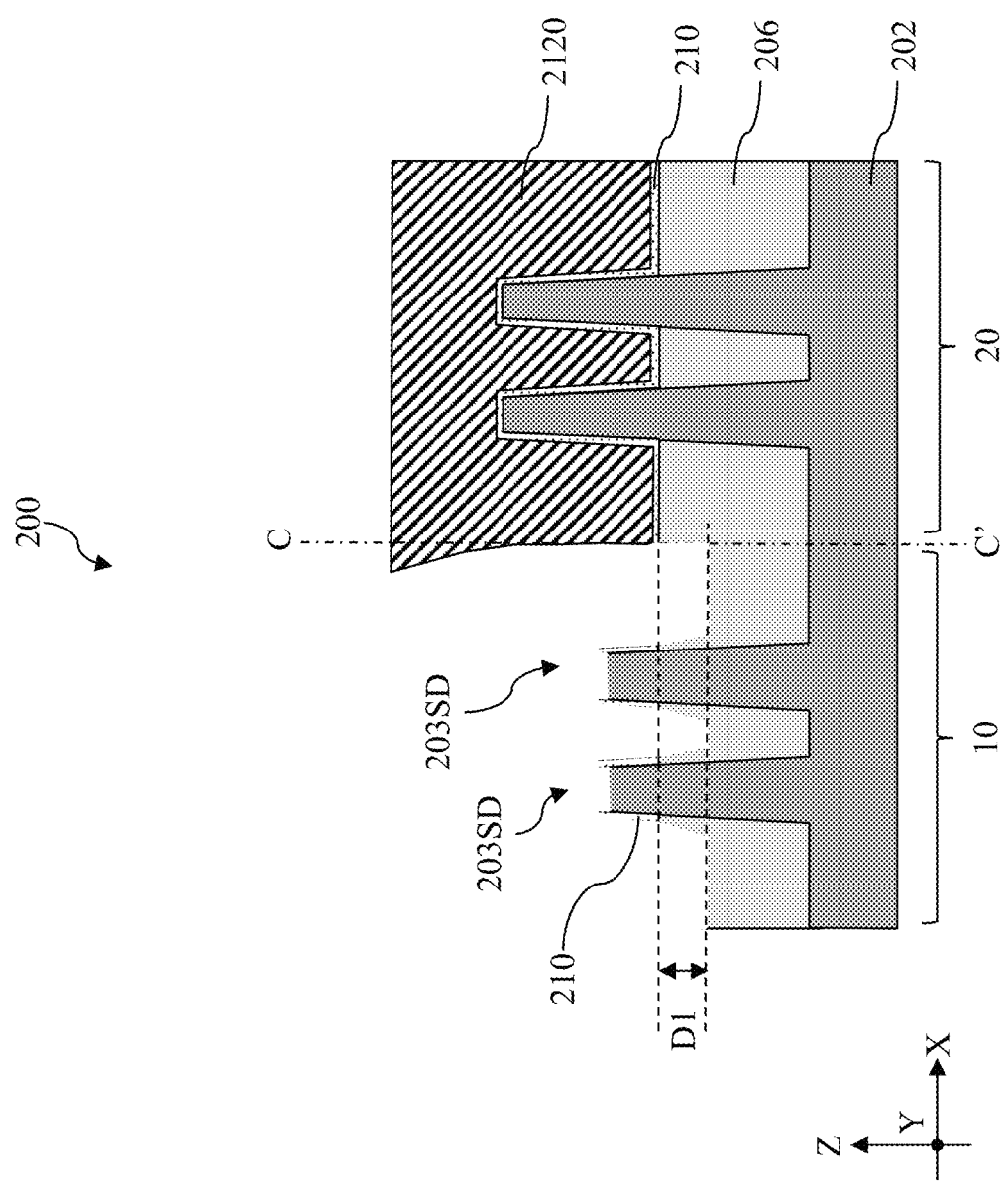
Figure 22:
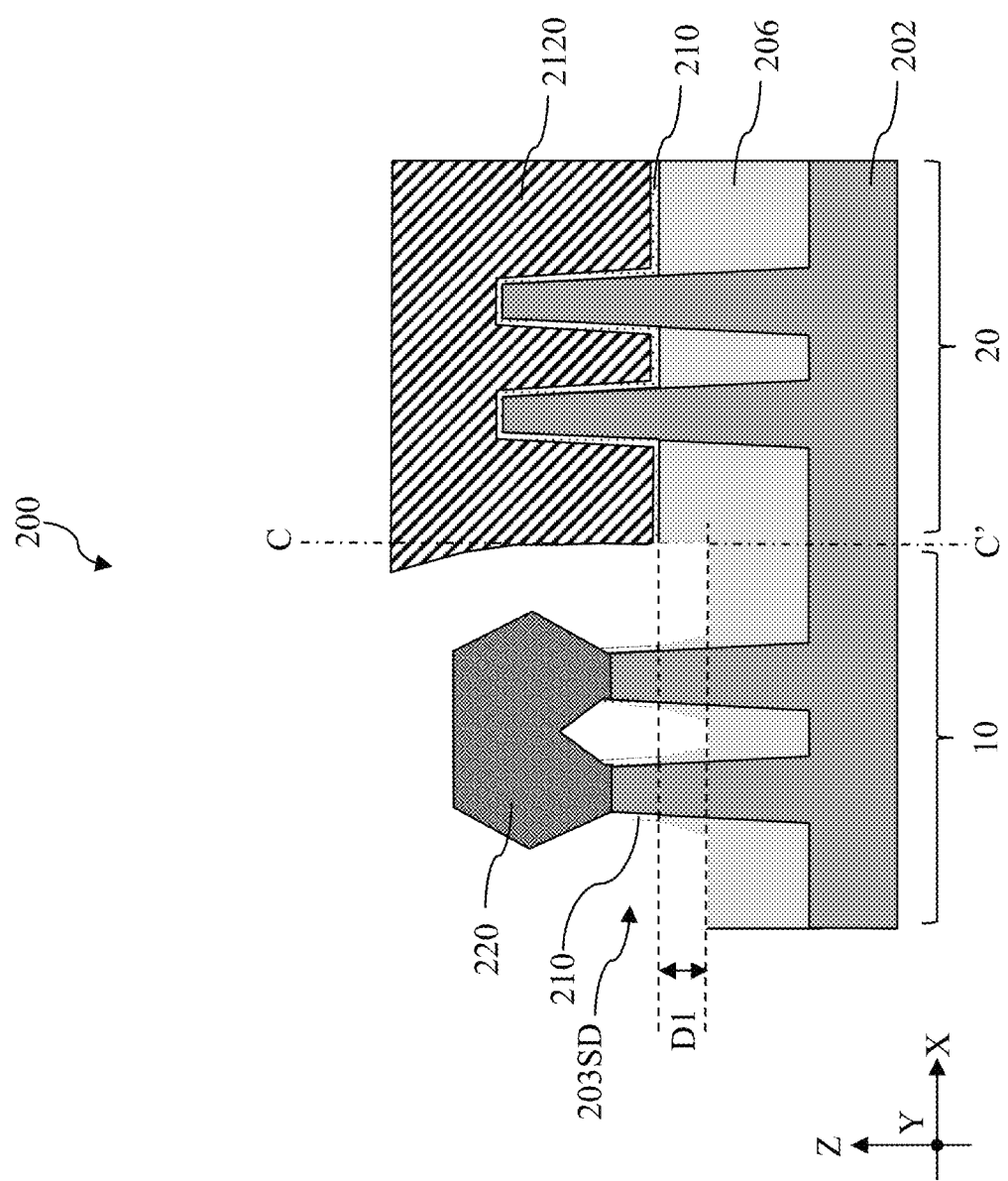
Figure 23:
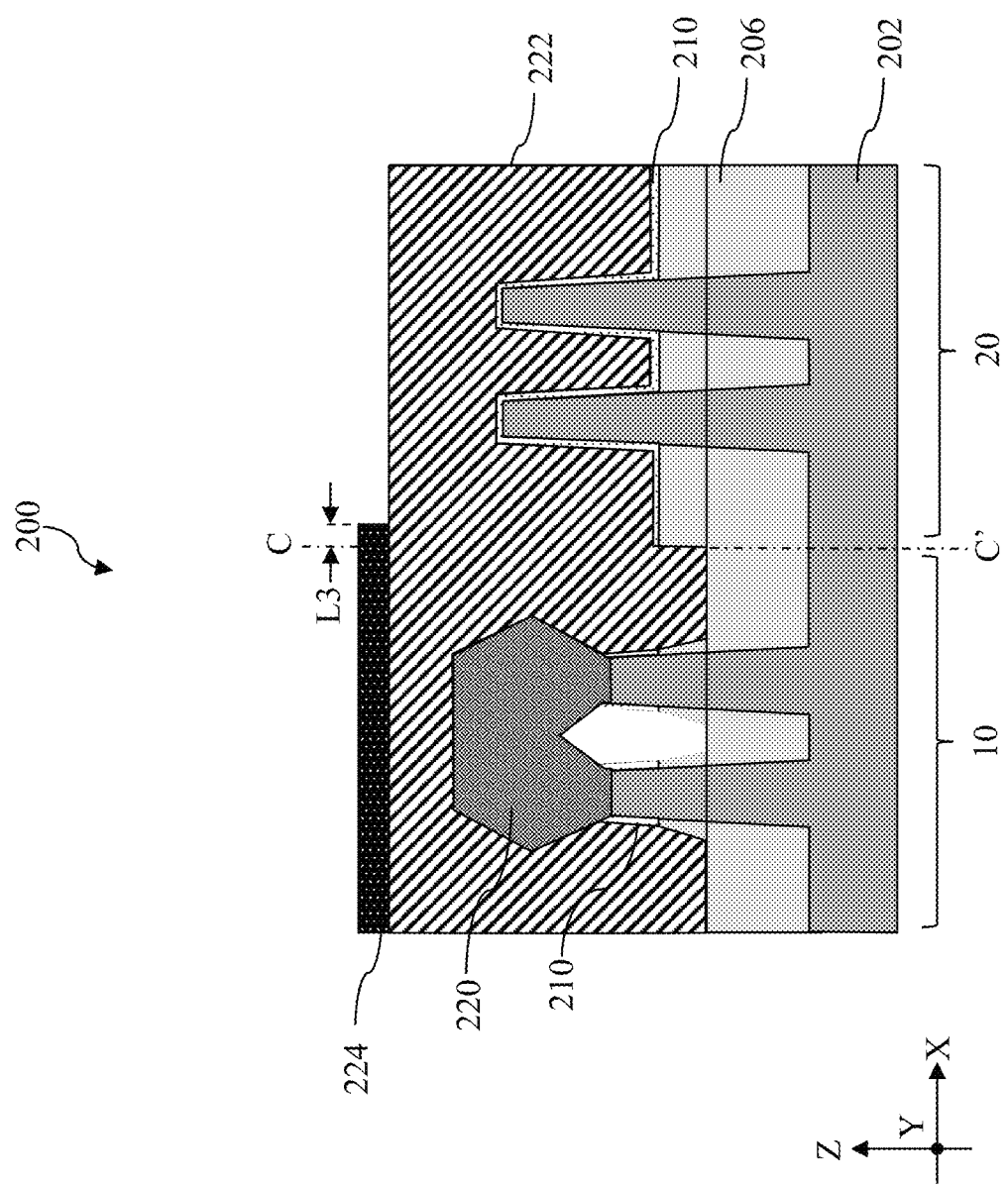
Figure 24:
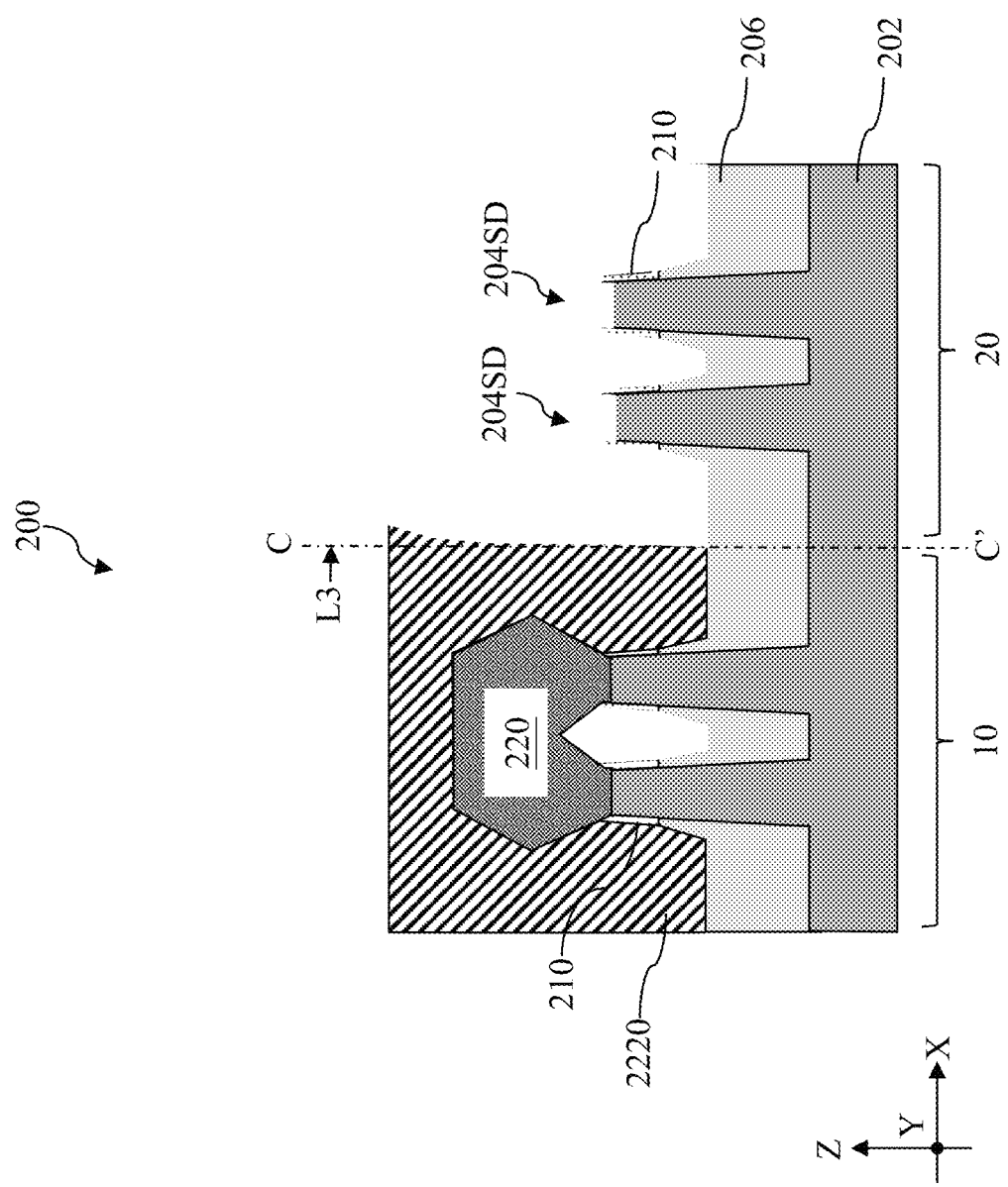
Figure 25:
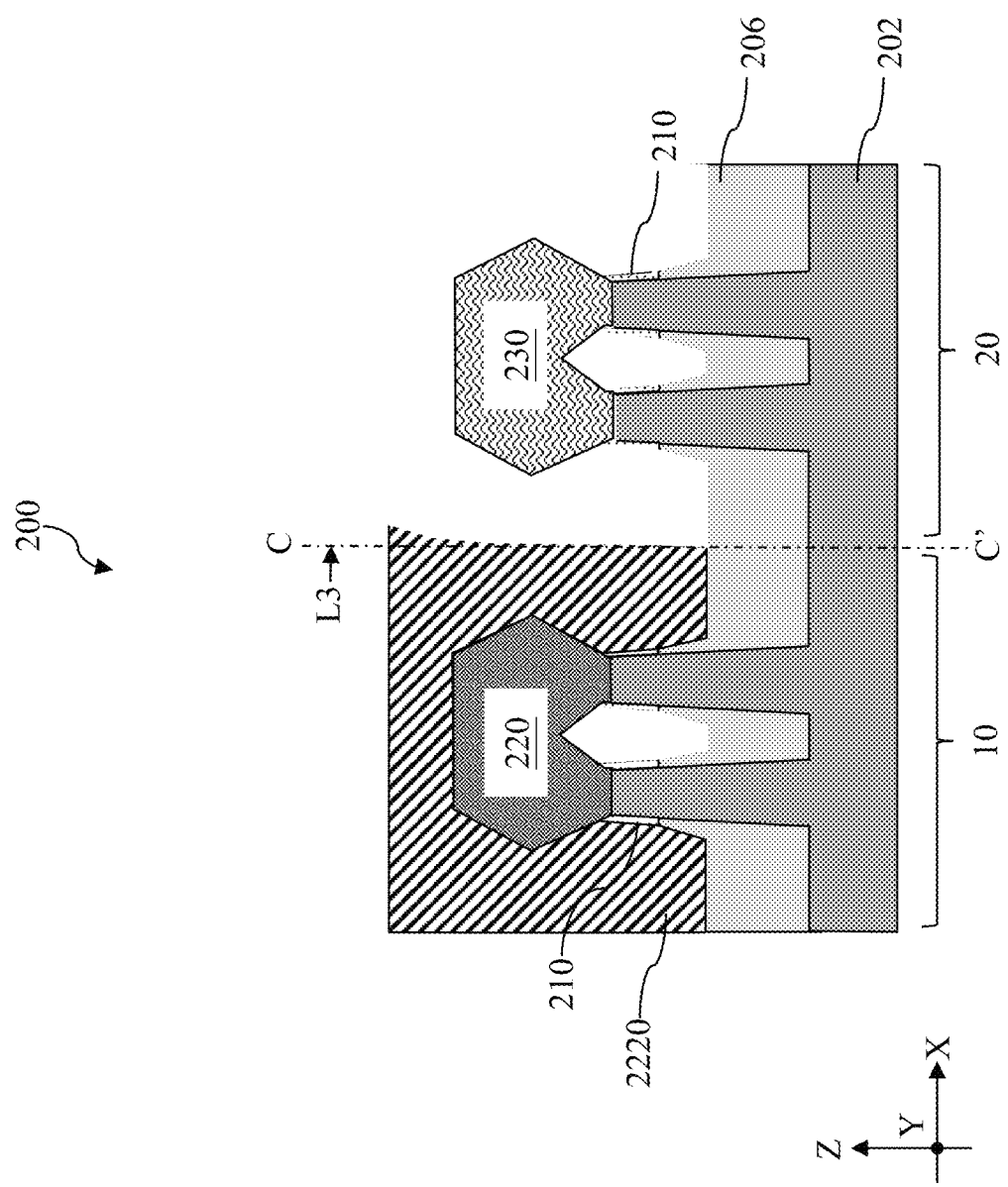

The plug 2360 in FIG. 19 may have a second depth D2 and a second width W2. In some embodiments, the second depth D2 may be between about 10 nm and about 30 nm and the second width W2 may be smaller than about 30% of the spacing S. This range is not trivial. When the second width W2 is greater than 30% of the spacing S, the trench would be so wide and rounded that it simply blends in with the isolation feature 206 and the resulting plug 2360 would blur with the environment. Referring to FIG. 20, in the second alternative embodiment, the first photoresist layer 214 formed at block 110 extends past the center line C-C' by a third offset L3 smaller than the first offset L1 but greater than the second offset L2. As a result, a bottom edge of the first pattern mask 2120 may be substantially aligned with the center line C-C', as illustrated in FIG. 21. After the first region 10 is etched to partially remove the gate spacer layer 210, the first source/drain feature 220 is formed over the first source/drain regions 203SD, as shown in FIG. 22. Referring to FIG. 23, the second photoresist layer 224 formed at block 116 extends past the center line C-C' by the same third offset L3. As a result, a bottom edge of the second pattern mask 2220 is also substantially aligned with the center line C-C', as representatively shown in FIG. 24. That is, in the second alternative embodiment, boundaries of the two recessing operations are substantially aligned. Because the isolation feature 206 near or around the center line C-C' is neither intact (i.e., unetched) or twice recessed, the isolation feature 206 near or around the center line C-C' may be substantially planar, without the ridge 240 shown in FIG. 12 or the plug 2360 shown in FIG. 19. After the second source/drain feature 230 is formed over the second region 20 as shown in FIG. 25, the CESL 234 and the ILD layer 236 are deposited over the first source/drain feature 220 and the second source/drain feature 230. As illustrated in FIG. 25, both the CESL 234 and the ILD layer 236 may be deposited on a flat surface 206T near or around the center line C-C'.

In one exemplary aspect, the present disclosure is directed to a semiconductor structure. The semiconductor structure includes a substrate including a first region and a second region adjacent the first region, a first fin disposed over the first region, a second fin disposed over the second region, a first source/drain feature disposed over the first fin and a second source/drain feature disposed over the second fin, and an isolation structure disposed between the first fin and the second fin. The isolation structure has a protruding feature rising above the rest of the isolation structure and the protruding feature is disposed between the first fin and the second fin and a width of the protruding feature is between about 10% and about 30% of a spacing between the first fin and the second fin.

In some embodiments, the first source/drain feature includes silicon and an n-type dopant and the second source/drain feature includes silicon germanium and a p-type dopant. In some implementations, the semiconductor structure further includes a dielectric layer disposed over the first source/drain feature, the second source/drain feature, the isolation structure, and the protruding feature. In some embodiments, the semiconductor structure further includes a gate spacer layer disposed between a top surface of the protruding feature and the dielectric layer. In some instances, the semiconductor structure further includes a contact etch stop layer disposed between the dielectric layer and the first source/drain feature, the dielectric layer and the second source/drain feature, the dielectric layer and the isolation structure, and the dielectric layer and sidewalls of the protruding feature. In some embodiments, the dielectric layer includes silicon oxide, the contact etch stop layer includes silicon nitride, and the gate spacer layer includes silicon oxycarbonitride. In some instances, a spacing between the first fin and the second fin is between about 20 nm and about 100 nm. In some embodiments, the protruding feature includes a height between about 10 nm and about 25 nm and a width between about 10% and about 30% of the spacing between the first fin and the second fin.

In another exemplary aspect, the present disclosure is directed to a semiconductor structure. The semiconductor structure includes a substrate having a first region and a second region adjacent the first region, a first fin and a second fin disposed over the first region, a third fin and a fourth fin disposed over the second region, an isolation structure disposed between the first fin and the second fin, between the first fin and the third fin, and between the third fin and the fourth fin, a first source/drain feature disposed over the first fin and the second fin, and a second source/drain feature disposed over the third fin and the fourth fin. The isolation structure includes a protruding feature rising above the rest of the isolation structure and the protruding feature is disposed between the first fin and the third fin. The first fin is closer to the third fin and the second fin is farther away from the third fin. The third fin is closer to the first fin and the fourth fin is farther away from the first fin.

In some embodiments, the semiconductor structure further includes a dielectric layer disposed over the isolation structure, the first source/drain feature, the second source/drain feature, and the protruding feature and the protruding feature extends into the dielectric layer. In some implementations, the semiconductor structure further includes a gate spacer layer disposed between a top surface of the protruding feature and the dielectric layer. In some embodiments, a composition of the gate spacer layer is different from a composition of the protruding feature. In some instances, the semiconductor structure further includes a contact etch stop layer disposed between the dielectric layer and the first source/drain feature, the dielectric layer and the second source/drain feature, the dielectric layer and the isolation structure, and the dielectric layer and sidewalls of the protruding feature. In some embodiments, the dielectric layer includes silicon oxide, the contact etch stop layer includes silicon nitride, and the gate spacer layer includes silicon oxycarbonitride. In some embodiments, the first source/drain feature includes silicon and an n-type dopant and the second source/drain feature includes silicon germanium and a p-type dopant.

In yet another exemplary aspect, the present disclosure is directed to a method. The method includes receiving a workpiece that includes a substrate having a first region and a second region, a first fin over the first region and including a first source/drain region, a second fin over the second region and including a second source/drain region, an isolation feature over the substrate such that a top portion of the first fin and a top portion of the second fin rise above the isolation feature. The method further includes depositing a gate spacer layer over the isolation feature, the first source/drain region, and the second source/drain region, forming a first pattern mask over the second fin, wherein an edge of the first pattern mask is closer to the first fin than the second fin, etching the first region and the first source/drain region using the first pattern mask as an etch mask, forming a first source/drain feature over the first source/drain region, forming a second pattern mask over the first source/drain feature and the first fin, wherein an edge of the second pattern mask is closer to the second fin than the first fin, and etching the second region using the second pattern mask as an etch mask, wherein the etching of the second region forms a protruding feature from the isolation feature and the protruding feature is disposed between the first fin and the second fin.

In some embodiments, a portion of the gate spacer layer is disposed on the protruding feature after the etching of the second region. In some implementations, the method further includes forming a dummy gate stack over a first channel region of the first fin and a second channel region of the second fin. The forming of the gate spacer layer includes depositing the gate spacer layer over the dummy gate stack. In some embodiments, the etching of the first region reduces a thickness of the isolation feature in the first region by between about 10 nm and about 25 nm. In some instances, the etching of the second region reduces a thickness of the isolation feature in the second region by between about 10 nm and about 25 nm.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate comprising a first region and a second region adjacent the first region;
   a first fin disposed over the first region;
   a second fin disposed over the second region;
   a first source/drain feature disposed over the first fin and a second source/drain feature disposed over the second fin; and
   an isolation structure disposed between the first fin and the second fin,
   wherein the isolation structure has a protruding feature rising above the rest of the isolation structure and the protruding feature is substantially equidistant from the first fin and the second fin,
   wherein a gate spacer is disposed on a top surface of the protruding feature,
   wherein a composition of the isolation structure is different from a composition of the gate spacer,
   wherein a width of the protruding feature is between about 10% and about 30% of a spacing between the first fin and the second fin.

2. The semiconductor structure of claim 1,
   wherein the first source/drain feature comprises silicon and an n-type dopant,
   wherein the second source/drain feature comprises silicon germanium and a p-type dopant.

3. The semiconductor structure of claim 1, further comprising:
   a dielectric layer disposed over the first source/drain feature, the second source/drain feature, the isolation structure, and the protruding feature,
   wherein the gate spacer is disposed between the top surface of the protruding feature and the dielectric layer.

4. The semiconductor structure of claim 3, further comprising: a contact etch stop layer disposed between the dielectric layer and the first source/drain feature, the dielectric layer and the second source/drain feature, the dielectric layer and the isolation structure, and the dielectric layer and sidewalls of the protruding feature.

5. The semiconductor structure of claim 4,
   wherein the dielectric layer comprises silicon oxide,
   wherein the contact etch stop layer comprises silicon nitride, and
   wherein the gate spacer layer comprises silicon oxycarbonitride.

6. The semiconductor structure of claim 1, wherein a spacing between the first fin and the second fin is between about 20 nm and about 100 nm.

7. The semiconductor structure of claim 6, wherein the protruding feature comprises a height between about 10 nm and about 25 nm.

8. The semiconductor structure of claim 1, wherein a dielectric constant of the gate spacer is smaller than a dielectric constant of silicon nitride.

9. A semiconductor structure, comprising:
a substrate comprising a first region and a second region adjacent the first region;
a first fin and a second fin disposed over the first region;
a third fin and a fourth fin disposed over the second region;
an isolation structure disposed between the first fin and the second fin, between the first fin and the third fin, and between the third fin and the fourth fin;
a first source/drain feature extending continuously from over the first fin to over the second fin; and
a second source/drain feature extending continuously from over the third fin to over the fourth fin,
wherein the isolation structure comprises a protruding feature rising above the rest of the isolation structure and the protruding feature is substantially equidistant from the first fin and the third fin,
wherein the first fin is closer to the third fin and the second fin is farther away from the third fin,
wherein the third fin is closer to the first fin and the fourth fin is farther away from the first fin.

10. The semiconductor structure of claim 9, further comprising:
a dielectric layer disposed over the isolation structure, the first source/drain feature, the second source/drain feature, and the protruding feature,
wherein the protruding feature extends into the dielectric layer.

11. The semiconductor structure of claim 10, further comprising:
a gate spacer layer sandwiched between a top surface of the protruding feature and the dielectric layer.

12. The semiconductor structure of claim 11, wherein a composition of the gate spacer layer is different from a composition of the protruding feature.

13. The semiconductor structure of claim 11, further comprising:
a contact etch stop layer disposed between the dielectric layer and the first source/drain feature, the dielectric layer and the second source/drain feature, the dielectric layer and the isolation structure, and the dielectric layer and sidewalls of the protruding feature.

14. The semiconductor structure of claim 13,
wherein the dielectric layer comprises silicon oxide,
wherein the contact etch stop layer comprises silicon nitride, and
wherein the gate spacer layer comprise silicon oxycarbonitride.

15. The semiconductor structure of claim 10,
wherein the first source/drain feature comprises silicon and an n-type dopant,
wherein the second source/drain feature comprises silicon germanium and a p-type dopant.

16. A method, comprising:
receiving a workpiece comprising:
a substrate comprising a first region and a second region, and
a first fin over the first region and comprising a first source/drain region,
a second fin over the second region and comprising a second source/drain region,
an isolation feature over the substrate such that a top portion of the first fin and a top portion of the second fin rise above the isolation feature;
depositing a gate spacer layer over the isolation feature, the first source/drain region, and the second source/drain region;
after the depositing of the gate spacer layer, forming a first pattern mask over the second fin, wherein an edge of the first pattern mask is closer to the first fin than the second fin;
etching the first region and the first source/drain region using the first pattern mask as an etch mask;
forming a first source/drain feature over the first source/drain region;
forming a second pattern mask over the first source/drain feature and the first fin, wherein an edge of the second pattern mask is closer to the second fin than the first fin; and
etching the second region using the second pattern mask as an etch mask,
wherein the etching of the second region forms a protruding feature from the isolation feature and the protruding feature is disposed between the first fin and the second fin,
wherein a top surface of the protruding feature is covered by the gate spacer layer.

17. The method of claim 16, wherein a portion of the gate spacer layer is disposed on the protruding feature after the etching of the second region.

18. The method of claim 16, further comprising:
forming a dummy gate stack over a first channel region of the first fin and a second channel region of the second fin,
wherein the forming of the gate spacer layer comprises depositing the gate spacer layer over the dummy gate stack.

19. The method of claim 16, wherein the etching of the first region reduces a thickness of the isolation feature in the first region by between about 10 nm and about 25 nm.

20. The method of claim 16, wherein the etching of the second region reduces a thickness of the isolation feature in the second region by between about 10 nm and about 25 nm.

* * * * *